(12) United States Patent
Akiyama et al.

(10) Patent No.: US 6,307,232 B1
(45) Date of Patent: *Oct. 23, 2001

(54) SEMICONDUCTOR DEVICE HAVING LATERAL HIGH BREAKDOWN VOLTAGE ELEMENT

(75) Inventors: Hajime Akiyama; Yoichiro Tarui, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/977,622

(22) Filed: Nov. 25, 1997

(30) Foreign Application Priority Data

Jun. 6, 1997 (JP) ................................................ 9-148947

(51) Int. Cl.$^7$ ........................... H01L 27/01; H01L 23/58; H01L 29/74; H01L 31/0312
(52) U.S. Cl. .......................... 257/347; 257/77; 257/129; 257/488
(58) Field of Search ..................................... 257/347, 350, 257/355, 168, 173, 177, 129, 339, 488, 77, 659, 409, 109

(56) References Cited

U.S. PATENT DOCUMENTS

| 5,031,021 | * | 7/1991 | Baba et al. | 257/490 |
| 5,270,568 | * | 12/1993 | Terashima | 257/487 |
| 5,378,912 | * | 1/1995 | Pein | 257/335 |
| 5,438,220 | * | 8/1995 | Nakagawa et al. | 257/487 |
| 5,985,708 | * | 11/1999 | Nakagawa et al. | 438/206 |

FOREIGN PATENT DOCUMENTS

| 0 317 445 | 5/1996 | (EP) . |
| 1-135070 | 5/1989 | (JP) . |
| 7-183522 | 7/1995 | (JP) . |

OTHER PUBLICATIONS

"High Voltage Thin Layer Devices (Resurf Devices)", J.A. Appels et al., IEDM Tech. Dig., 1979, pp. 238–241.

"High Breakdown Voltage for Isolated SOI Structue", K. Akiyama et al., Association of Electronic Device–Semiconductor Power Conversion, Oct. 30, 1992 EDD–92–106 SPC–92–72, pp. 1–6.

"Intense Blue emission From Porous β–SiC Formed on C+–implanted Silicon", L. Liao et al., Appl. Phys. Lett. vol. 66 No. 18, May 1, 1995, pp. 2382–2384.

"High Voltage Device Structures for Trench Isolated SOI Power ICs", N. Yasuhara et al, Research & Development Center Semiconductor Group Toshiba Corporation EDD–1992–68, pp. 69–74.

"New High Voltage SOI Device Structure Eliminating Substrate Bias Effects", A Nakagawa et al., Proc. of IEDM '96, pp. 477–480.

* cited by examiner

Primary Examiner—Tom Thomas
Assistant Examiner—Shouxiang Hu
(74) Attorney, Agent, or Firm—McDermott, Will & Emery

(57) ABSTRACT

A diode having a p$^+$ semiconductor region, an n$^-$ drift region and an n$^+$ semiconductor region is formed in an SOI layer. An SiC layer is formed in the bottom surface of a semiconductor layer. Further, a capacitive coupled multiple field plate including conductive layers is formed between cathode and anode electrodes. As a result, a semiconductor device with a lateral high breakdown voltage element having extremely high breakdown voltage which is never restricted by electric field concentration in the surface of the SOI layer can be achieved.

3 Claims, 22 Drawing Sheets

BV=309.0V
Nsoi=5.0×10$^{14}$cm$^{-3}$

BV=320.1V
$N_{soi}=1.0×10^{15}cm^{-3}$

BV=328.1V
$N_{soi}=2.0\times10^{15} cm^{-3}$

BV=303.5V
$N_{soi}=4.0\times10^{15}cm^{-3}$

C ION

POLISHING

C ION

SEMICONDUCTOR DEVICE HAVING LATERAL HIGH BREAKDOWN VOLTAGE ELEMENT

BACKGROUND OF THE INVENTION

1. Field of the Invention

The present invention relates to a semiconductor device having a lateral high breakdown voltage element, and more specifically, to a semiconductor device having a lateral high breakdown voltage element with an SOI (Semiconductor on Insulator) structure and capable of maintaining a high breakdown voltage.

2. Description of the Background Art

First, a conventional technique will be described.

FIG. 36 is a schematic cross sectional view showing a first example of a conventional semiconductor device. With reference to FIG. 36, the semiconductor device is provided with an insulation substrate 103. An n⁻ semiconductor layer 102 (referred to as an SOI layer) is formed on insulation substrate 103. An n⁺ semiconductor region 104 with low resistance is formed in the surface of n⁻ semiconductor layer 102. A p⁺ semiconductor region 105 is formed to surround the n⁻ semiconductor layer 102. A cathode electrode 106 is electrically connected to n⁺ semiconductor region 104. An anode electrode 107 is electrically connected to p⁺ semiconductor region 105. A back electrode 108 is formed on the back surface of insulation substrate 103. An insulation film 109 is provided in n⁻ semiconductor layer 102 for electrically isolating n⁻ semiconductor layer 102 to provide a plurality of portions. An insulation layer 111 is provided on n⁻ semiconductor layer 102 for electrically isolating cathode and anode electrodes 106 and 107 from other portions.

The operation of the semiconductor device will now be described.

With reference to FIG. 37, when anode and back electrodes 107 and 108 are at 0V and + voltage is applied to cathode electrode 106, a depletion layer 133 extends from a pn junction between n⁻ semiconductor layer 102 and p⁺ semiconductor region 105. The extension of depletion layer 133 stops when it reaches n⁺ semiconductor region 104. Depletion layer 133 is a kind of insulator, allowing no current flow between cathode and anode electrodes 106 and 107. Such a semiconductor device is referred to as a diode.

Furthermore, addition of an insulation gate structure to this structure enables fabrication of a self-arc-extinguishing device such as an MOS (Metal Oxide Semiconductor) transistor, an IGBT (Insulated Gate Bipolar Transistor) or the like. It is noted that voltage is not allotted to insulation layer 103 in the above structure.

N⁻ semiconductor layer 102 must be large to retain the major part of electric field in order to achieve higher breakdown voltage with a semiconductor device having the above structure. While horizontal (normal to the sheet of drawings) extension of the layer can be relatively readily achieved, vertical (longitudinal direction in the drawings) extension disadvantageously expands the isolation region as large thickness $t_{soi}$ of the SOI layer is required, making techniques for isolation and burying difficult.

FIG. 38 is a schematic cross sectional view showing a second example of a conventional semiconductor device. With reference to FIG. 38, n⁻ semiconductor layer 102 is formed on a semiconductor substrate 101 with a buried insulation layer 103 formed of an oxide film interposed. Since other members in the drawing are almost the same as those for the conventional semiconductor device shown in FIG. 36, the same or corresponding portions have the same reference numerals and description thereof will not be repeated here.

The operation will now be described.

With reference to FIG. 39, when anode and back electrodes 107 and 108 are at 0V and + voltage is applied to cathode electrode 106, a depletion layer A extends from a pn junction between n⁻ semiconductor layer 102 and p⁺ semiconductor region 105. At the time, semiconductor substrate 101 is generally at 0V and functions as a field plate through buried insulation layer 103, so that a depletion layer B extends from the interface between n⁻ semiconductor layer 102 and buried insulation layer 103 toward the surface of n⁻ semiconductor layer 102 in addition to the above mentioned depletion layer A. On the other hand, the electric field at the pn junction between n⁻ semiconductor layer 102 and p⁺ semiconductor region 105 is reduced as depletion layer B facilitates the extension of depletion layer A.

The effect is generally called RESURF (Reduced Surface Field) effect, and it is described in J. A. Appels et al., "HIGH VOLTAGE THIN LAYER DEVICES (RESURF DEVICES)", *IEEE IEDM Tech. Dig.*, 1979, pp. 238–241 that extending the pn junction along the interface rather than buried insulation layer 103 provides a similar effect.

In the above structure, a ratio of divided voltage per unit thickness of oxide film to silicon is that of a reciprocal of their dielectric constants ($\epsilon_{oxi}$=3.9, $\epsilon_{si}$=11.7), that is, about 3:1. Thus, breakdown voltage can be increased by increasing the thickness of buried oxide film 3 retaining a considerable part of voltage.

This is shown FIG. 40. RESURF effect is effective in the region where breakdown voltage increases with thickness. As the thickness of a film is simply increased, breakdown voltage (BV) reversely begins to decrease at a certain value. This is because the amount of extension for depletion layer B decreases as it is away from the ground voltage of semiconductor substrate 101 assisting the extension of depletion layer B, thereby undermining electric field reduction effect for depletion layer A. Accordingly, the thickness of the buried oxide film must be around 7 μm to achieve as high a breakdown voltage as 600V. In a film formation method, however, the formation of such a film with thickness of around 7 μm disadvantageously increases cost as considerably long processing time is required as shown in FIG. 41.

A technique disclosed in Japanese patent Laying-Open No. 7-183522 will now be described as a conventional example for forming the thinnest possible buried oxide film while maintaining high breakdown voltage.

FIG. 42 is a schematic cross sectional view showing a structure of a semiconductor device disclosed in the aforementioned laid open application. With reference to FIG. 42, a semiconductor layer 102 is formed on a semiconductor substrate 101 with a buried insulation layer 103 interposed. A field oxide film layer 111b and an LDMOS transistor are formed in the surface of semiconductor layer 102.

The LDMOS transistor includes a channel region 105a, a source region 105b, a drain region 104, a drift region 120, a gate oxide insulation layer 111a and a gate electrode layer 112. Channel region 105a is formed on one side of field oxide film layer 111b, whereas source region 105b is positioned in the surface of channel region 105a. Drain region 104 is positioned in the surface on the side opposite to source region 105b with field oxide insulation layer 111a sandwiched.

Gate electrode layer 112 is formed on channel region 105a with gate oxide insulation layer 111a therebetween and extends over field oxide layer 111b.

Drift region 120 is formed from the bottom surface of field oxide insulation layer 111a to that of semiconductor layer 102 and toward the side of drain region 104 from that of source region 105b, and formed of SiC (Silicon Carbide), for example.

In addition, a source electrode 107 and a drain electrode 106 are formed to be electrically connected to source and channel regions 105b and 105a as well as drain region 104, respectively.

An SiC layer used for drift region 120 does not exert any influence specific to SiC in chemical treatment, photolithography and implantation diffusion steps for the surface of SOI layer, thereby allowing fabrication of a device directly using a standard Si process.

SiC has a wider band gap than Si (Silicon), the material used for forming the semiconductor layer. Thus, replacing Si by SiC can enhance avalanche electric field strength, thereby increasing breakdown voltage without increasing the thickness of buried isolation layer 103.

In this structure, however, a gate is formed offset, and therefore laterally applied voltage V concentrates in a short distance $W_1$ between gate electrode layer 122 and drain electrode 106, increasing electric field strength. This is shown by the equipotential line and electric field strength distribution in FIGS. 43A and 43B. It is noted that FIG. 43B shows the electric field strength distribution in the surface portion of SOI layer 102 along the line XLIIIB—XLIIIB in FIG. 43A.

With reference to FIGS. 43A and 43B, avalanche electric field strength is more easily attained when electric field strength E is increased. If avalanche electric field strength is attained in the surface portion of SOI layer 102, breakdown voltage can not effectively be enhanced even when the bottom portion of the SOI layer is formed of an SiC layer. Therefore, the effect of offset can be achieved only in a limited region having relatively low breakdown voltage, which is capable of retaining the concentrated electric field in the surface by means of a field oxide film.

Further, distance $W_1$ between gate electrode layer 112 and drain electrode 106 can be made longer to prevent the concentration of laterally applied voltage. In this case, electric field strength generally decreases as compared with FIG. 43B. Nevertheless, a high electric field region is likely to be formed locally in the opposite ends R and electric field strength peak P is in the high electric field region. Electric field strength E in the peak portion P is therefore likely to attain avalanche electric field strength, and once avalanche electric field strength is attained, breakdown voltage cannot effectively be increased as mentioned in the foregoing.

A combination of parameters required for a substrate (thickness and resistance values of SOI layer, thickness of buried insulation layer or the like) can be optimized to decrease the peak value. This may however result in disadvantageous introduction of new rate-limiting factors.

SUMMARY OF THE INVENTION

It is an object of the present invention to provide a semiconductor device having a lateral high breakdown voltage element with extremely high breakdown voltage which is not restricted by electric field concentration in the surface of an SOI layer.

A semiconductor device having a lateral high breakdown voltage element according to et first aspect of the present invention has a semiconductor layer formed on a semiconductor substrate with a buried insulation layer interposed and a high breakdown voltage element formed in the semiconductor layer, and provided with a wide band gap layer and a conductive layer for a field plate. The high breakdown voltage element includes first and second impurity regions of mutually opposite conductivity types formed on the semiconductor layer. The wide band gap layer is located at least in the region to have the highest electric field strength in the semiconductor layer when breakdown voltage is applied to the high breakdown voltage element and formed of a material having a band gap wider than that of the semiconductor layer. The conductive layer for a field plate is formed in a floating state on that region of semiconductor layer which is between first and second impurity regions with an insulation layer interposed, and is capable of storing capacitance between itself and a first electrode electrically connected to the first impurity region as well as between itself and a second electrode electrically connected to second impurity region.

In a semiconductor device having a lateral high breakdown voltage element according to the first aspect of the present invention, a conductive layer for a field plate is provided, so that electric field in the surface of the semiconductor layer can be uniformly distributed. As a result, the electric field strength in the surface of the semiconductor layer cannot attain avalanche electric field strength. Therefore, extremely high breakdown voltage can be achieved through a synergistic effect of breakdown voltage enhancement effects due to the conductive layer for a field plate and the wide band gap layer provided in the region where the highest electric field strength is attained.

In the above aspect, the wide band gap layer preferably has an SiC layer. The use of the SiC layer enables fabrication of a device directly using a standard Si process.

In the above aspect, preferably, further provided is a drift region located within the semiconductor layer between the fist and second impurity regions, having the same conductivity type as the first impurity region and lower impurity concentration than that of the first impurity region, and forming a pn junction between itself and the second impurity region. The provision of the drift region enables high breakdown voltage.

In the above aspect, preferably, first impurity region is formed in the surface of the semiconductor layer and the wide band gap layer is located near the surface of the semiconductor layer where the first impurity region is formed. As a result, even when the electric field strength near the region having the first impurity region becomes the highest, it cannot attain avalanche electric field strength.

In the above aspect, the wide band gap layer is preferably provided immediately below the first impurity region. As a result, even when the electric field strength immediately below the first impurity region becomes the highest, it cannot attain avalanche electric field strength.

In the above aspect, the wide band gap layer is preferably located on the bottom surface of the semiconductor layer on the side of the buried insulation film. As a result, even when the electric field strength in the bottom surface of the semiconductor layer becomes the highest, it cannot attain avalanche electric field strength.

In the above aspect, the wide band gap layer is preferably spaced apart from the bottom surface of the semiconductor layer on the side of buried insulation layer. As a result, the wide band gap layer can prevent the extension of an avalanche region from the bottom surface of the semiconductor layer, resulting in high breakdown voltage. Further, strong adhesion between the semiconductor layer and the buried insulation layer can readily be ensured and plastic deformation caused by the stress due to the difference in coefficient of heat expansion can be prevented as direct contact between the wide band gap layer and the buried insulation layer can be avoided.

In the above aspect, preferably, the wide band gap layer has the impurity of the same conductivity type as the drift region and the impurity concentration therefor is at least twice to at most ten times that of the drift region. As a result, a still higher breakdown voltage enhancement effect can be achieved due to still higher critical electric field strength.

A semiconductor device having a lateral high breakdown voltage element according to another aspect of the present invention has a semiconductor layer formed on a semiconductor substrate with a buried insulation layer interposed, a high breakdown voltage element formed in a semiconductor layer and a wide band gap layer. The high breakdown voltage element includes first and second impurity regions of mutually opposite conductivity types formed in the semiconductor layer, and a drift region located between the first and the second impurity regions and having the same conductivity type as the first impurity region and a lower impurity concentration than that of the first impurity region. The wide band gap layer is located at least in the region, which is to have the highest electric field strength in semiconductor layer when breakdown voltage is applied to the high breakdown voltage element, and formed of a material having a band gap wider than that of the semiconductor layer. The wide band gap layer has the impurity of the same conductivity type as the second impurity region and electrically short-circuited to the second impurity region.

In a semiconductor device having a lateral high breakdown voltage according to another aspect of the invention, a wide band gap layer has the impurity of the same conductivity type as the second impurity region and electrically connected to a second impurity region. As a result, extremely high breakdown voltage can be achieved through a synergistic effect of breakdown voltage enhancement effects due to the wide band gap layer thus formed and that provided in that region which is to have the highest electric field strength.

In the above aspect, preferably, the wide band gap layer and a third impurity region are formed adjacent to each other on the bottom surface of the semiconductor layer on the side of a buried insulation layer, and the third impurity region is of the same conductivity type as and electrically short-circuited to the second impurity region. As a result, higher breakdown voltage can be achieved.

In the above aspect, preferably, fourth and fifth impurity regions of mutually opposite conductivity types alternately located along the direction in which the bottom surface of the semiconductor layer extends is further provided. The wide band gap layer is formed to sandwich the fourth and fifth impurity regions with the second impurity region, and electrically short-circuited to the second impurity region through the fifth impurity region. As a result, carrier implantation from a collector region to a wide band gap layer can be prevented during on operation when the lateral high breakdown voltage is an IGBT, thereby increasing the number of carriers contributable to conductivity modulation and avoiding increase in on voltage.

In the above aspect, preferably, a conductive layer for a field plate is further provided which is formed on that region of the semiconductor layer which is sandwiched between the first and second impurity regions with an insulation layer interposed in a floating state, and capable of storing capacitance between itself and a first electrode electrically connected to the first impurity region as well as between itself and a second electrode electrically connected to the second impurity region. The provision of the conductive layer for a field plate allows uniform distribution of the electric field in the surface of the semiconductor layer. As a result, the electric field strength in the surface of the semiconductor layer cannot attain avalanche electric field strength. Thus, extremely high breakdown voltage can be achieved through a synergistic effect of breakdown voltage enhancement effects due to the conductive layer for a field plate and the wide band gap layer provided in the region to have the highest electric field strength.

A semiconductor device having a lateral high breakdown voltage element according to still another aspect of the present invention has a semiconductor layer formed on a semiconductor substrate with a buried insulation layer interposed, a high breakdown voltage element formed in the semiconductor layer and a wide band gap layer. The high breakdown voltage element has first and second impurity regions of mutually opposite conductivity types formed in the semiconductor layer. The wide band gap layer is located at least in the region which is to have the highest electric field strength in the semiconductor layer when breakdown voltage is applied to the high breakdown voltage element, and formed of a material having a band gap wider than that of the semiconductor layer. The wide band gap layer is porous.

In a semiconductor device having a lateral high breakdown element according to still another aspect of the present invention, a wide band gap layer is porous, so that diffusion and proliferation of avalanche current can be prevented due to the presence of pores. As a result, extremely high breakdown voltage can be achieved through a synergistic effect of an effect due to pores and a breakdown voltage enhancement effect due to a wide band gap layer provided in the region which is to have the highest electric field strength.

In the above aspect, preferably, the wide band gap layer is of the same conductivity type as a first impurity region. Thus, higher breakdown voltage can be achieved.

In the above aspect, preferably, the wide band gap layer has the impurity of the same conductivity type as and electrically short-circuited to a second impurity region. As a result, extremely high breakdown voltage can be achieved through a synergistic effect of breakdown voltage enhancement effects due to the wide band gap layer thus provided and that provided in the region which is to have the highest electric field strength.

In the above aspect, the wide band gap layer and a third impurity region are preferably formed adjacent to each other in the surface of the semiconductor layer on the side of a buried insulation layer. The third impurity region is of the same conductivity type as the second impurity region, and porous. Thus, diffusion and proliferation of avalanche current can be prevented due to pores also in the third impurity region.

In the above aspect, preferably, a conductive layer for a field plate is further provided which is formed in a floating state on that region of the semiconductor layer which is sandwiched between first and second impurity regions with an insulation layer interposed, and capable of storing capacitance between itself and a first electrode electrically connected to the first impurity region as well as between itself and a second electrode electrically connected to the second impurity region. The provision of the conductive layer for a field plate allows uniform distribution of electric field in the surface of the semiconductor layer. Thus, the electric field strength in the surface of the semiconductor layer cannot attain avalanche electric field strength. As a result, extremely high breakdown voltage can be achieved through a synergistic effect of breakdown voltage enhancement effects due to the conductive layer for a field plate and the wide band gap layer provided in the region which is to have the highest electric field strength.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5A shows electric field distribution, FIG. 5B electric field strength distribution along the line VB—VB in FIG. 5A and FIG. 5C electric field strength distribution along the line VC—VC in FIG. 5A.

FIG. 43A shows electric field distribution and FIG. 43B electric field strength distribution along the line XLIIIB—XLIIIB in FIG. 43A.

DESCRIPTION OF THE PREFERRED EMBODIMENTS

Embodiments of the present invention will now be described with reference to the drawings.

First Embodiment

Figure 1:
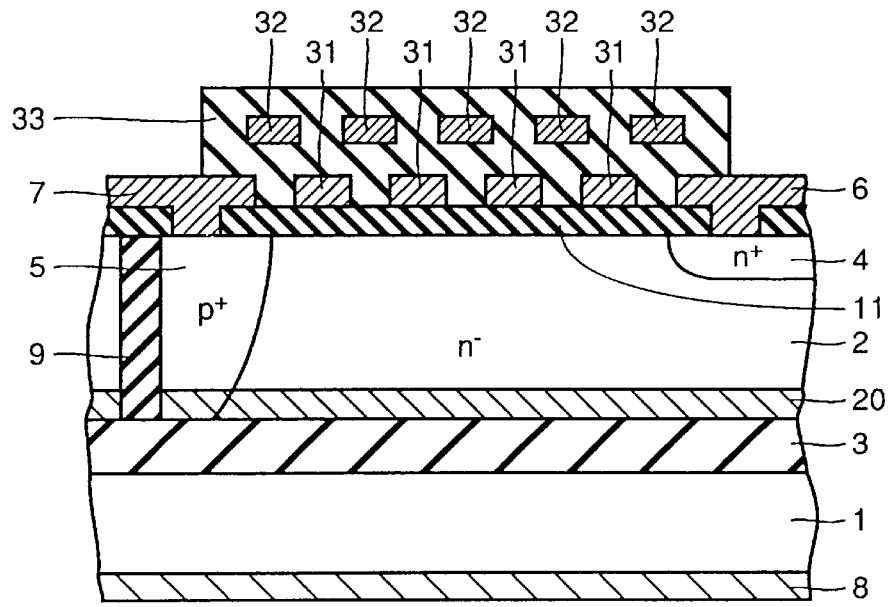
FIG. 1 is a cross sectional view schematically showing a structure of a semiconductor device having a lateral high breakdown voltage element according to a first embodiment of the present invention.

With reference to FIG. 1, an n$^-$ semiconductor layer (SOI layer) 2 is formed on a semiconductor substrate 1 with a buried insulation 3 interposed. A diode is formed in the n$^-$ semiconductor layer 2.

The diode has an n$^+$ semiconductor region 4 and a p$^+$ semiconductor region 5. The region of n$^-$ semiconductor layer 2 is herein used as an n$^-$ drift region as it is and forms a pn junction with p$^+$ semiconductor region 5. Further, p$^+$ semiconductor region 4 is formed in the surface of semiconductor layer 2 within n–drift region 2.

Cathode and anode electrodes 6 and 7 are formed to be electrically connected to the n$^+$ semiconductor region 4 and p$^+$ semiconductor region 5, respectively. An insulation layer 11 is provided on n$^-$ semiconductor layer 2 for electrically isolating cathode and anode electrodes 6 and 7 from other portions.

In the lateral high breakdown voltage element such as this diode, a wide band gap layer 20 is formed at least in a region which is to have the highest electric field strength within n$^-$ semiconductor layer 2 when breakdown voltage is applied (for example when 0V and + voltage are applied to anode and cathode electrodes 7 and 6, respectively). The wide band gap layer 20 is formed of a material, such as SiC, having a band gap wider than Si used for semiconductor layer 2.

A capacitive coupled multiple field plate including a plurality of conductive layers 31 and 32 is formed on insulation layer 11 between cathode and anode electrodes 6 and 7. Each of the plurality of conductive layers 31 and 32 is insulated by insulation layer 33 and formed in a floating state (in an island state).

A back electrode 8 is formed on the back surface of semiconductor substrate 1.

In the semiconductor device having such a lateral high breakdown voltage element, a high electric field region is locally formed in the bottom portion of SOI layer 2 due to electric field concentration when reverse blocking voltage is applied (when breakdown voltage is applied). This is well known, for example from Akiyama et al., *Materials from Association of Electronic Device-Semiconductor Power Conversion*, EDD-92-106 (SPC-92-72), 1992 or the like. Then, noting that avalanche electric field strength for SiC is $4.0 \times 10^6$ V/cm, approximately one order of magnitude higher than $3.7 \times 10^5$ V/cm for Si, an SiC thin film layer 20 having thickness of about 0.4 to 0.6 $\mu$m can be applied to the portion likely to have the highest electric field strength in SOI layer 2 in order to essentially enhance avalanche resistance amount and breakdown voltage.

Accordingly, how much breakdown voltage can effectively be improved in the present invention as compared with a conventional example was calculated by means of device simulation. The condition and result will now be described.

First, the inventive example is defined as a device having SiC layer 20 as shown in FIG. 1, whereas a conventional example is defined as that without SiC layer. In addition, the common conditions for SOI substrates is that the thickness of the SOI layer is 15 $\mu$m, the thickness of the buried oxide film is 5 $\mu$m and the distance between A (anode) and K (cathode) of the device is 88 $\mu$m. Based on the common conditions, the breakdown voltages for the present and conventional examples are compared using Si-SOI resistivity as a parameter. The result is shown in FIG. 2.

Figure 2:
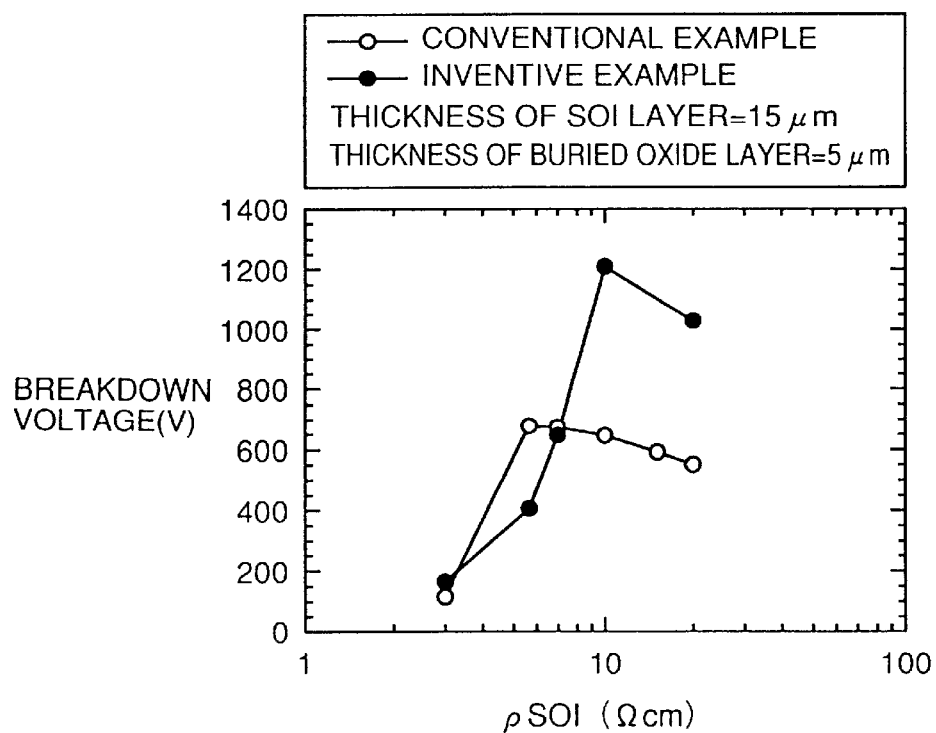
FIG. 2 is a graph comparing breakdown voltages for a structure according to the first embodiment of the present invention and a conventional structure without an SiC layer.

With reference to FIG. 2, although the conventional and inventive examples are different in that RESURF effect is seen at 6 $\Omega$·cm or more for the conventional example and at 10 $\Omega$·cm for the inventive example, the highest breakdown voltages are 661V and 1126V, respectively, the inventive example resulting in breakdown voltage enhancement effect twice as high as that for the conventional example. This confirmed the fact that the provision of SiC film layer in the region which would have locally high electric field can increase breakdown voltage.

Figure 42:
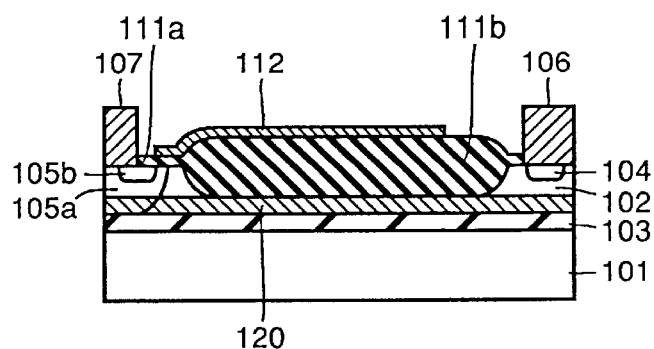
FIG. 42 is a cross section schematically showing a structure of a semiconductor device disclosed in aforementioned laid open application.
Figure 43A:
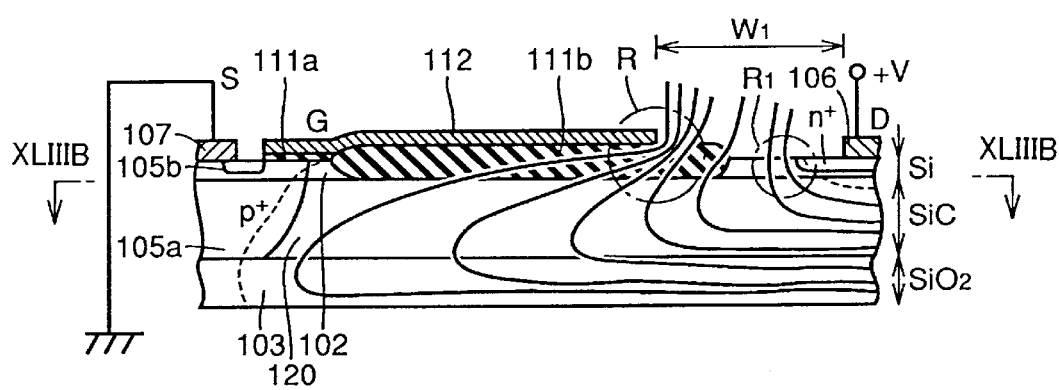
FIGS. 43A and 43B are diagrams showing that electric field is unevenly distributed in the structure shown in FIG. 42, where
Figure 43B:
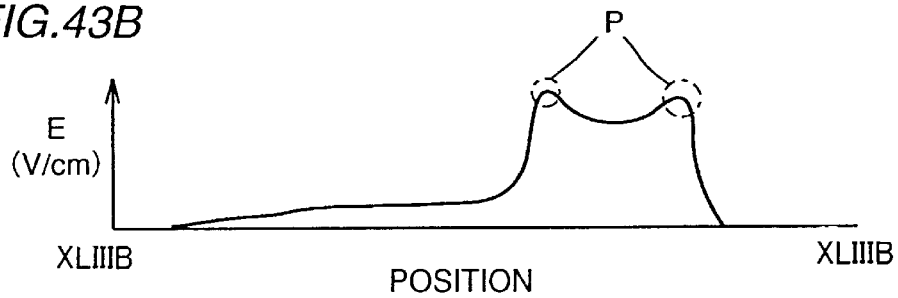

The mere provision of SiC layer 20 can, however, result in extremely limited breakdown voltage enhancement effect due to uneven distribution of electric field strength as in the conventional example shown in FIG. 42. The present embodiment therefore provides capacitive coupled multiple field plates 31 and 32 between cathode and anode electrodes 6 and 7.

Figure 3:
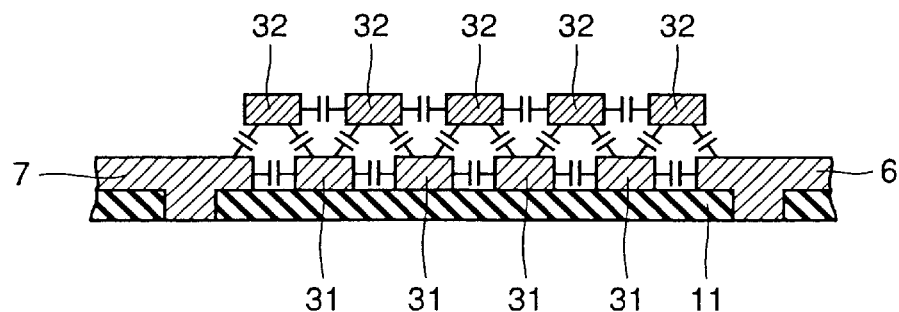
FIG. 3 is a partial sectional view showing in enlargement a part of a capacitive coupled multiple field plate shown in FIG. 1.
Figure 4:
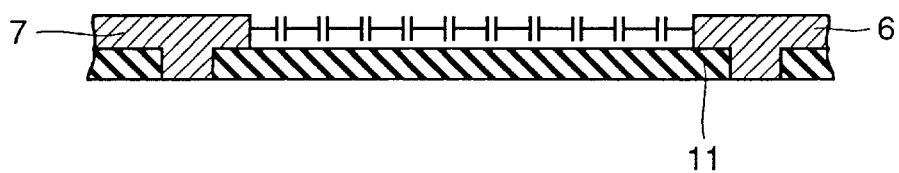
FIG. 4 is a view showing a function of the capacitive coupled multiple field plate.

The capacitive coupled multiple field plates 31 and 32 form a capacitor between cathode and anode electrodes 6 and 7 with conductive layers 31 and 32 when potential is applied to cathode and anode electrodes 6 and 7 as shown in FIG. 3. As shown in FIG. 4, a plurality of capacitors are connected in series between cathode and anode electrodes 6 and 7.

Figure 5:
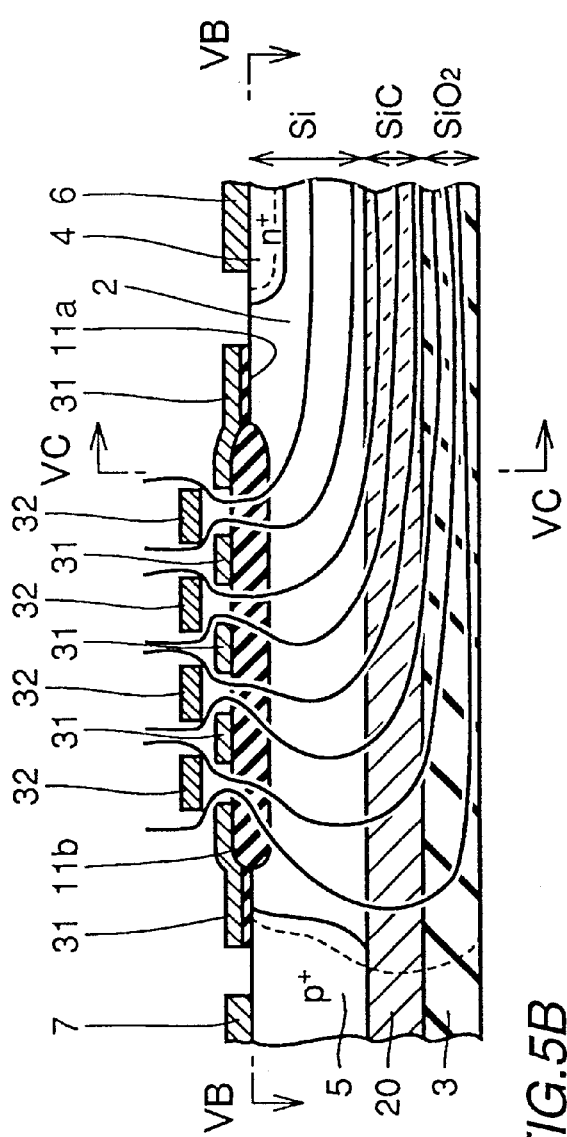
FIGS. 5A to 5C are diagrams showing the uneven distribution of electric field can be prevented in the semiconductor device having a lateral high breakdown voltage element according to the first embodiment of the present invention, where

Such capacitors between cathode and anode electrodes 6 and 7 make lines of electric force in the surface of a semiconductor layer 2 almost uniform as shown in Fig. 5A. As a result, electric field strength on the surface side of semiconductor layer 2 is almost uniformly distributed as shown in FIG. 5B, avoiding uneven distribution of electric field strength.

Thus, although only the bottom portion of semiconductor layer 2 has relatively high electric field strength, breakdown voltage can be even more effectively increased because of an SiC thin film layer 20 formed in the bottom portion. In other words, the present embodiment provides uniform distribution of electric field strength in semiconductor layer 2 by replacing the region where avalanche is experienced with SiC thin film layer 20 to increase electric field strength at which avalanche is caused, and at the same time provides a capacitive coupled multiple field plate in the surface portion of semiconductor layer 2. A lateral high breakdown voltage element with much higher breakdown voltage than in the conventional examples can be achieved only through synergizing these two effects.

Second Embodiment

Figure 6:
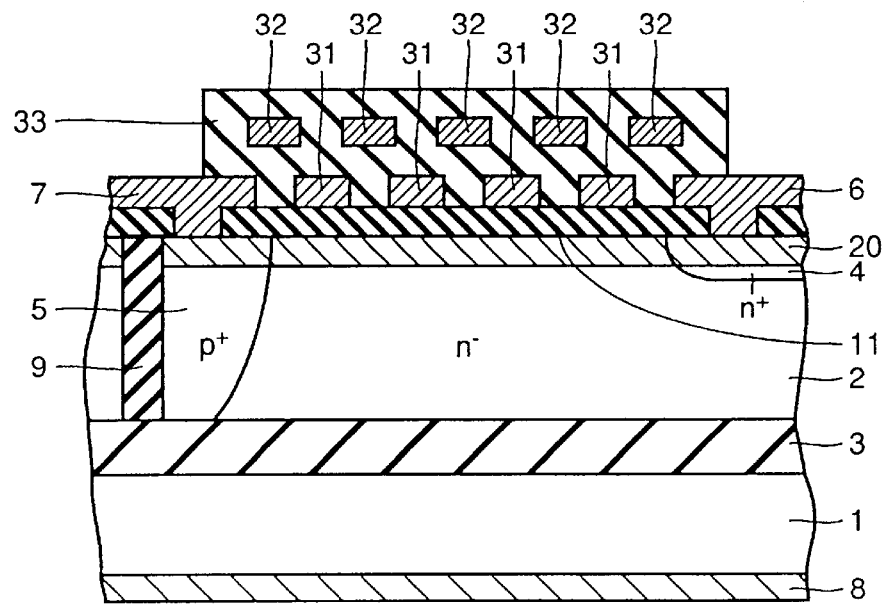
FIG. 6 is a cross sectional view schematically showing a structure of a semiconductor device having a lateral high breakdown voltage element according to a second embodiment of the present invention.
Figure 7:
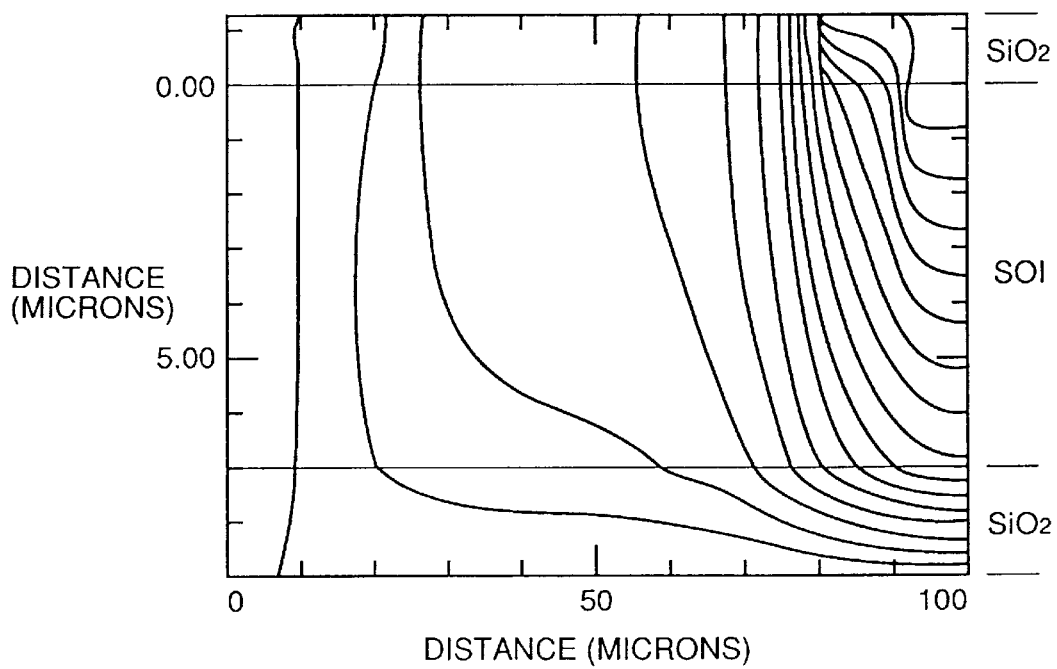
FIGS. 7 to 10 are first to fourth diagrams showing electric field concentration.
Figure 8:
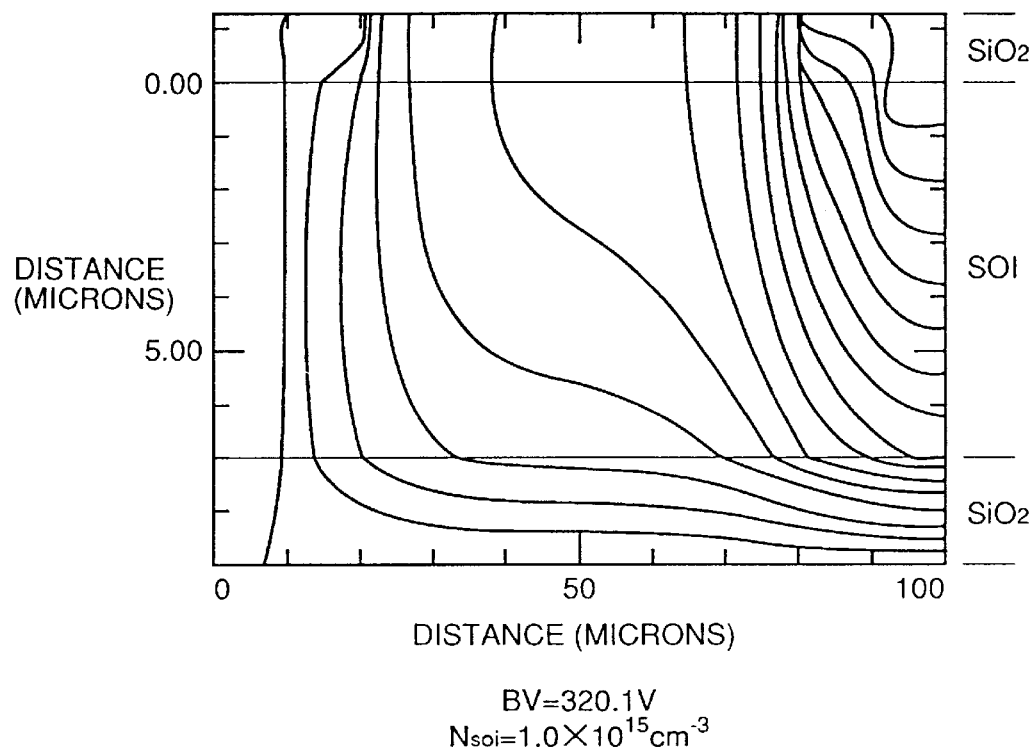
Figure 9:
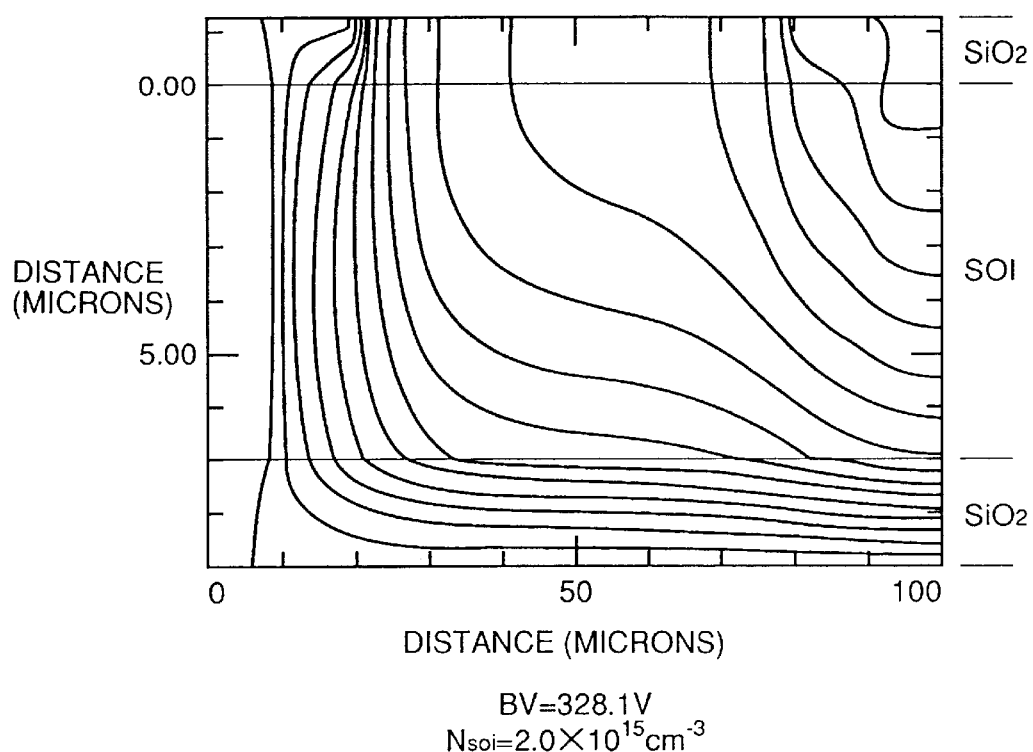

With reference to FIG. 6, an SiC thin film layer 20 is formed in the surface of a semiconductor layer 2 in the present embodiment.

It is noted that other parts of the structure are almost the same as those in the above mentioned first embodiment (FIG. 1), and therefore the same component has the same reference numeral and the description thereof is will not be repeated here.

The structure of the present embodiment is effective in manufacturing an SOI active layer substrate 2 with resistivity higher than that optimally required for maintaining high breakdown voltage due to RESURF effect in a power device, especially from the need in designing, such as in the case of one chip inverter where a power device and a logic IC (Integrated Circuit) are formed together. This is described in the following in further detail.

FIGS. 7 to 10 are diagrams showing potential distributions for different impurity concentrations in the SOI layer which are herein incorporated from the above mentioned reference Akiyama, *Materials from association of Electronic Device-Semiconductor Power Conversion*, EDD-92-106 (SPC-92-72), 1992. Impurity concentrations Nsoi for each SOI layer are $5.0 \times 10^{14}$ cm$^{-3}$ in FIG. 7, $1.0 \times 10^{15}$ cm$^{-3}$ in FIG. 8, $2.0 \times 10^{15}$ cm$^{-3}$ in FIG. 9 and $4.0 \times 10^{15}$ cm$^{-3}$ in FIG. 10, respectively.

Figure 10:
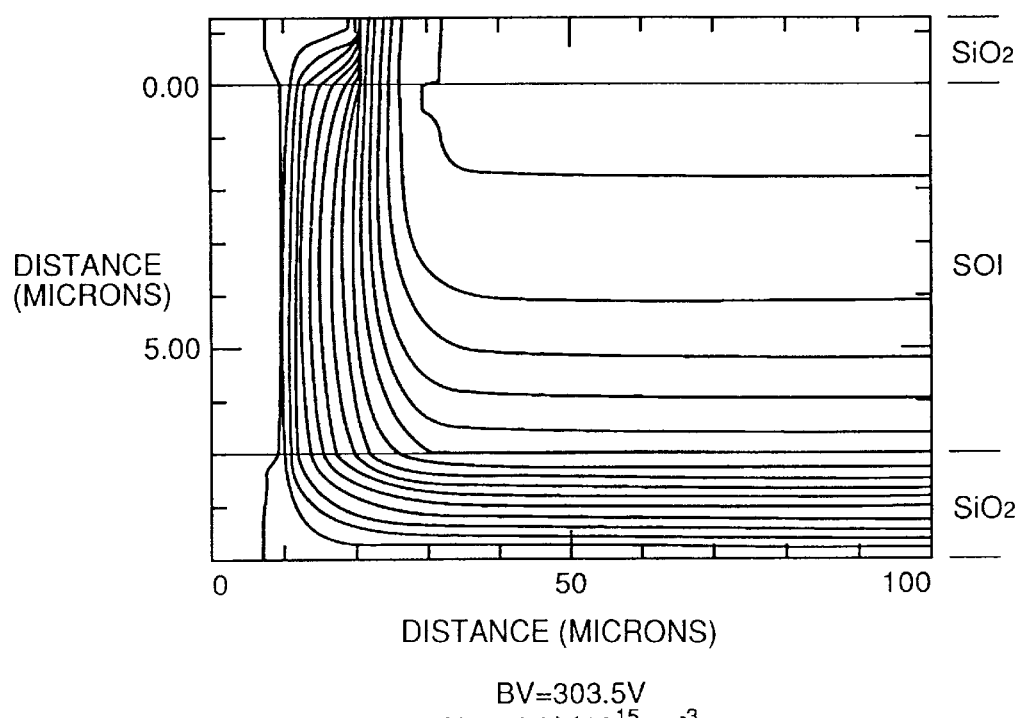

With reference to FIGS. 7 to 10, electric field is concentrated in the surface side of the SOI active layer at a higher resistivity of 10 $\Omega$·cm ($5 \times 10^{14}$ cm$^{-3}$ in FIG. 7) and 5 $\Omega$·cm ($1 \times 10^{15}$ cm$^{-3}$ in FIG. 8), on the bottom side of the SOI active layer at a resistivity of 3 $\Omega$·cm ($2 \times 10^{15}$ cm$^{-3}$ in FIG. 9) and RESURF effect is reduced at a lower resistivity of 1 $\Omega$·cm ($4 \times 10^{15}$ cm$^{-3}$ in FIG. 10). The change in the position of a breakpoint due to electric field concentration for these changes in impurity concentration is shown FIG. 11.

Figure 11:
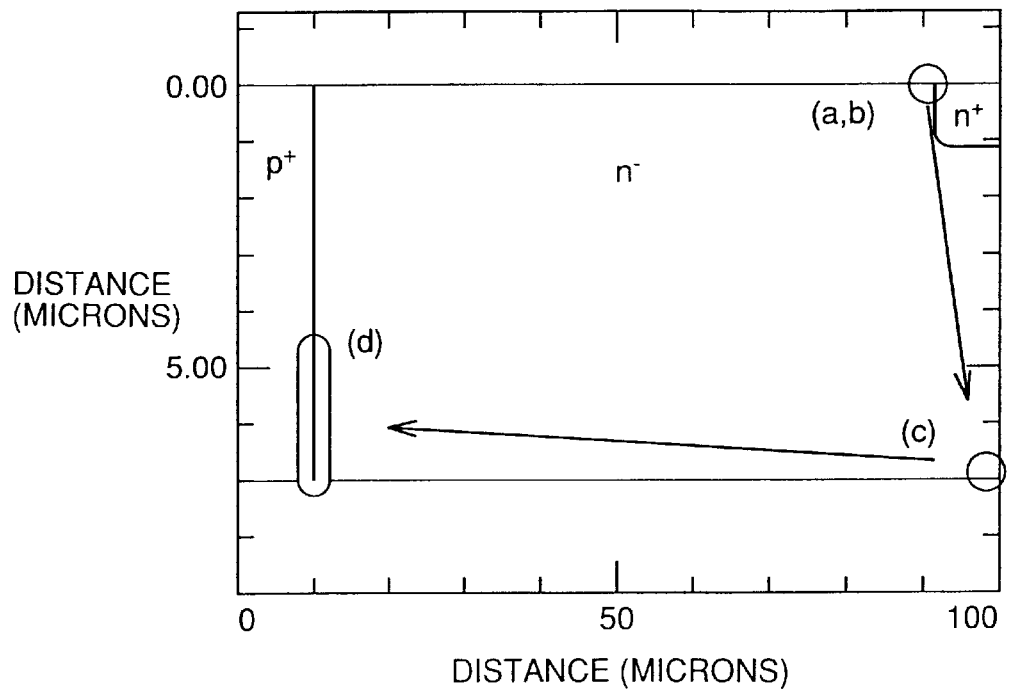
FIG. 11 is a diagram showing how a breakpoint changes with the impurity concentration in an SOI layer.

With reference to FIG. 11, the position of a breakpoint due to electric field concentration is in the surface of the SOI layer (a, b) with relatively low concentration in the SOI layer, moves to the bottom portion of the SOI layer (c) with increased impurity concentration in the SOI layer, and then to the junction surface (d) between a p$^+$ semiconductor region and an n-semiconductor region. It is noted that reference numerals a, b, c and d in the drawing respectively correspond to conditions in FIGS. 7 to 10.

As shown in FIG. 6, in the present embodiment, SiC layer 20 is formed on the surface of SOI layer 2, resulting in extremely high breakdown voltage enhancement effect under the condition of higher resistivity in the SOI active layer corresponding to a and b in FIG. 11.

Third Embodiment

Figure 12:
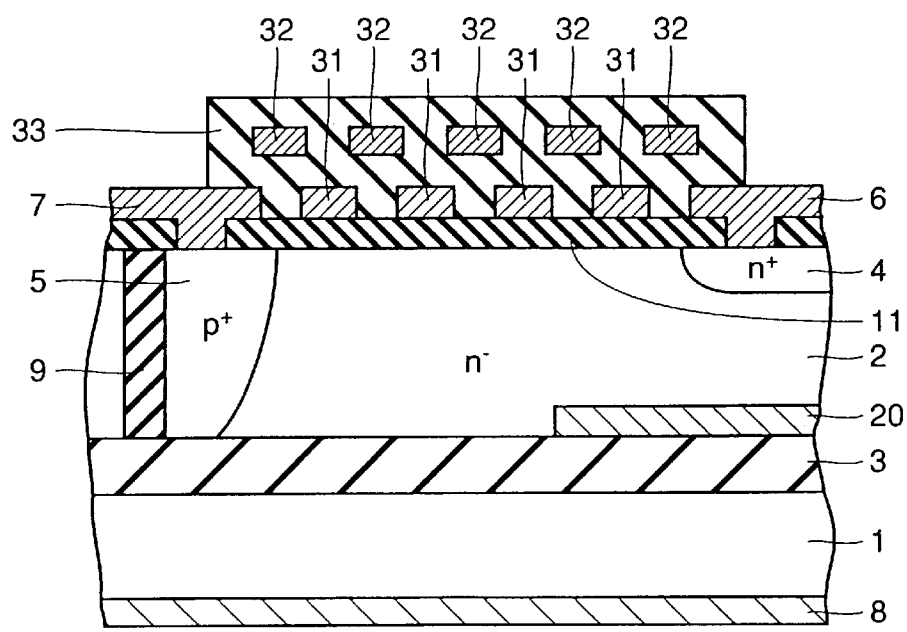
FIGS. 12 to 15 are cross sectional views schematically showing a structure of a semiconductor device having a lateral high breakdown voltage element according to third to sixth embodiments of the present invention.

With reference to FIG. 12, in the present embodiment, an SiC thin film layer 20 is located immediately below a cathode electrode 6 in the bottom surface of a semiconductor layer 2. It is noted that other parts of the structure are almost the same as those in the first embodiment shown in FIG. 1, and therefore the same component has the same numeral and the description thereof will not be repeated here.

In the present embodiment, as described in conjunction with c in FIG. 11, extremely high breakdown voltage enhancement effect can be achieved when the breakdown voltage determined by RESURF effect causes avalanche phenomenon immediately below cathode electrode 6 in the bottom surface portion of SOI layer 2.

Fourth Embodiment

Figure 13:
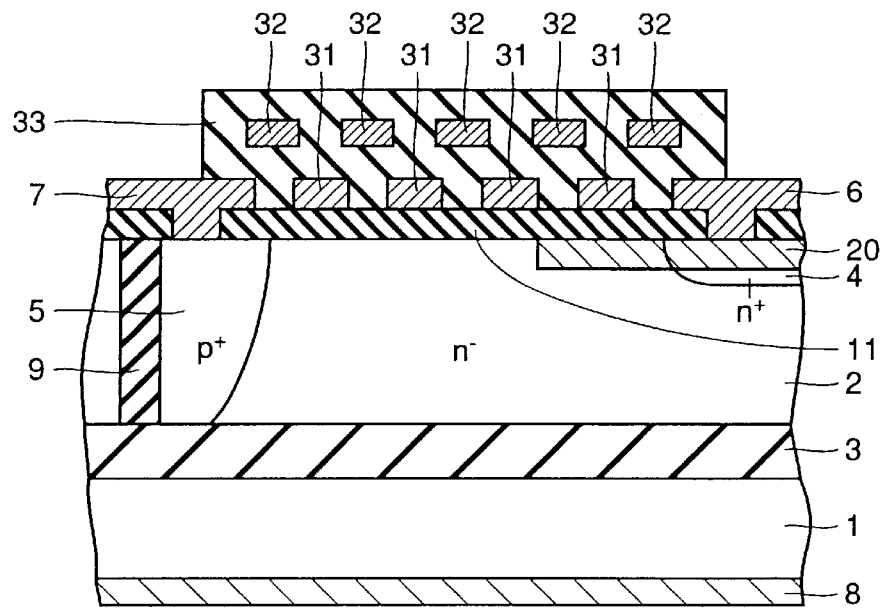

With reference to FIG. 13, in the present embodiment, an SiC thin film layer 20 is selectively formed near an $n^+$ semiconductor region 4 in the surface of a semiconductor layer 2. It is noted that the other part of the structure is almost the same as that in the first embodiment shown in FIG. 1, and therefore the same component has the same reference numeral and the description thereof will not be repeated here.

In the present embodiment, extremely high breakdown voltage enhancement effect can be achieved when the breakdown voltage determined by RESURF effect causes avalanche phenomenon in the surface portion of a semiconductor layer 2 right below a cathode electrode 6 as shown at a and b in FIG. 11.

Fifth Embodiment

Figure 14:
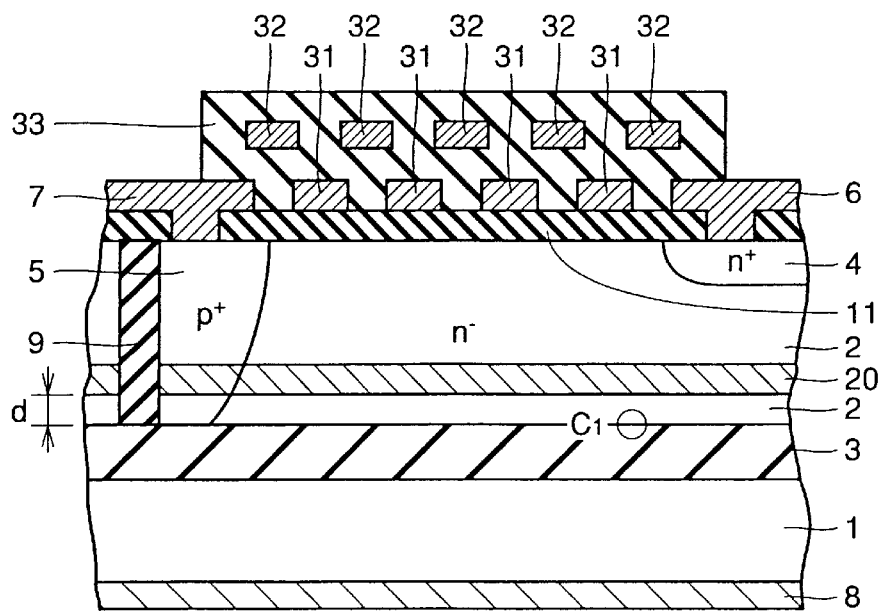

With reference to FIG. 14, in the present embodiment, an SiC thin film layer 20 is spaced apart from the bottom surface of a semiconductor layer 2 by a distance d. The distance d is 0.5 $\mu$m at most. It is noted that the other parts of the structure are almost the same as those shown in the first embodiment shown in FIG. 1, and therefore the same component has the same reference numeral and description thereof will not be repeated here.

In the present embodiment, as described in conjunction with c in FIG. 11, extremely high breakdown voltage enhancement effect can be achieved when the breakdown voltage determined by RESURF effect causes avalanche phenomenon in the bottom surface potion of a semiconductor layer 2 immediately below a cathode electrode 6.

When breakdown voltage is applied, avalanche phenomenon keeps increasing starting from an avalanche phenomenon starting point indicated at a point $C_1$ in FIG. 14 until it reaches an SiC thin film layer 20 separated by distance d, where the extension of the avalanche region is restrained. In addition, as distance d is relatively short and 0.5 $\mu$m at most, a stage for rate-limiting breakdown voltage characteristics is not attained, and finally, breakdown voltage is not determined until avalanche phenomenon proceeds in SiC thin film layer 20. As a result, high breakdown voltage is achieved.

Further, a structure of the present embodiment is effective when an interface of SiC thin film layer 20 and a buried insulation layer 3 directly adjacent to each other is to be avoided in device processing as SiC thin film layer 20 is formed spaced apart from the interface. It is especially effective, for example, when strong adhesion cannot be readily ensured or plastic deformation may occur in the SOI substrate due to the stress caused by the difference in coefficients of thermal expansion.

Sixth Embodiment

Figure 15:
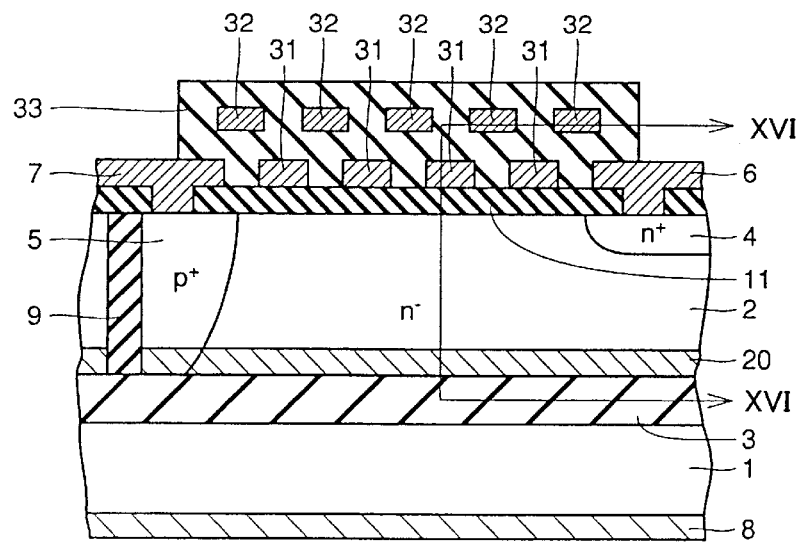
Figure 16:
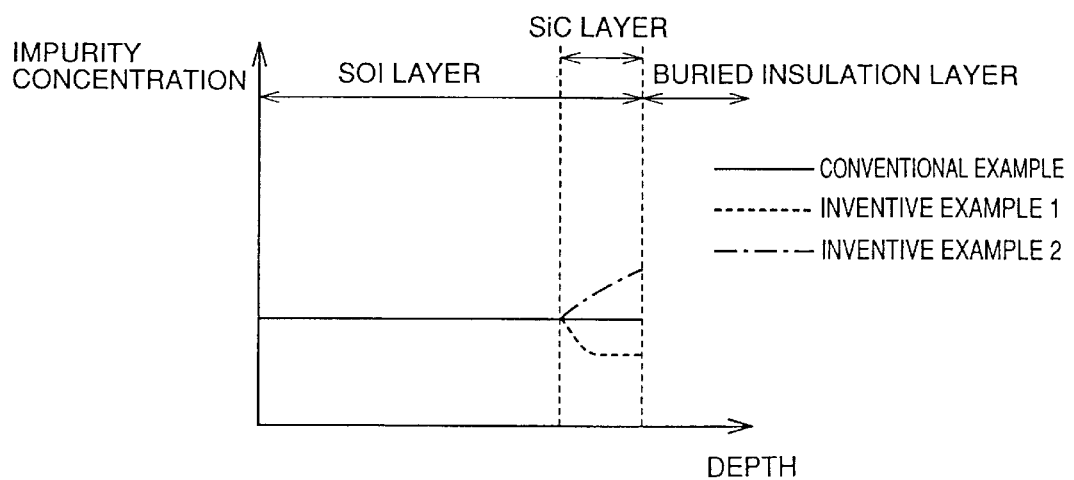
FIG. 16 is a graph showing impurity concentration distribution along the line XVI—XVI in FIG. 15.

With reference to FIGS. 15 and 16, in the present embodiment, although an SiC thin film layer 20 is located in the same position as that in the first embodiment shown in FIG. 1, the impurity concentration distribution in the SiC thin film layer 20 differs from that in the first embodiment. In the present embodiment, the impurity of the same conductivity type (n type) as a semiconductor layer 2 is contained in the SiC thin film layer 20 having a concentration from at least twice to at most ten times that of the impurity in semiconductor layer 2. It is noted that the other parts of the structure are almost the same as those in the first embodiment shown in FIG. 1, and therefore the same component has the same reference numeral and the description thereof will not be repeated here.

A solid line indicating impurity concentration distribution in the SiC thin film layer in FIG. 16 shows a conventional example, a dotted line shows impurity concentration distribution generally admitted when SiC thin film layer 20 is formed by means of C (carbon) ion implantation in the semiconductor layer (the first example of the present invention), and a chain-dotted line shows impurity concentration distribution for the present embodiment (the second example of the present invention).

Although it is apparent that the first example of the present invention in FIG. 16 can achieve breakdown voltage enhancement effect as compared the conventional example, the second example of the present invention can achieve still higher breakdown voltage enhancement effect as compared with the first example of the present invention. This is because still higher critical electric field strength can be achieved with higher impurity concentration in SiC thin film layer 20 where avalanche phenomena starts within the range satisfying a condition for depletion required for RESURF effect when reverse blocking voltage applied.

Seventh Embodiment

Figure 17:
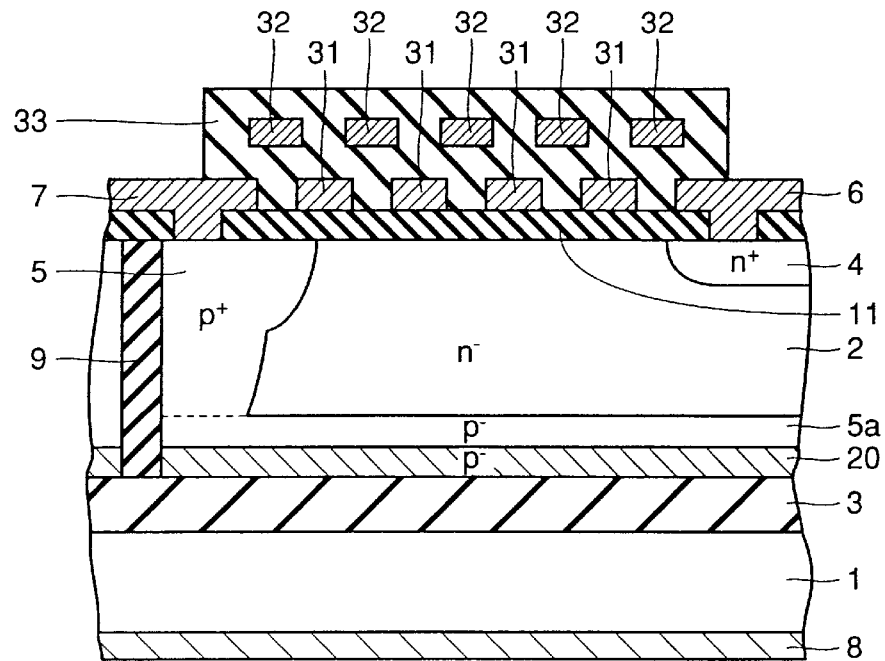
FIGS. 17 to 19 are cross sectional views schematically showing a structure of a semiconductor device having a lateral high breakdown voltage element according to seventh to ninth embodiments of the present invention.

With reference to FIG. 17, in the present embodiment, an SiC thin film layer 20 is formed on the bottom surface of an SOI layer 2 and is the opposite conductivity type (p type) of an $n^-$ semiconductor layer 2. A $p^-$ semiconductor region 5a formed adjacent to SiC thin film layer 20 is formed on SiC thin film layer 20 to be also electrically short-circuited to a $p^+$ semiconductor region 5. Impurity concentrations of $p^-$ semiconductor region 5a and SiC thin film layer 20 are lower than that of $p^+$ semiconductor region 5.

It is noted that the other parts of the structure are almost the same as those in a first embodiment shown in FIG. 1, and therefore the same component has the same reference numeral and the description thereof will not be repeated here.

The operation will now be described.

With reference to FIG. 17, a depletion layer starts extending from a junction interface between $n^-$ semiconductor layer 2 and $p^+$ semiconductor region 5 as well as that between $p^-$ semiconductor region 5a and $n^-$ semiconductor layer 2. The extension of the depletion layer extending from both portions can be promoted by RESURF effect. Reducing p type impurity concentration for $p^-$ semiconductor region 5a and SiC thin film layer 20 to approximately the same level of concentration for $n^-$ semiconductor region 2 allows complete depletion of both of thin film layers 20 and 5a with relatively low reverse bias voltage, and the voltage exceeding the low reverse bias voltage will be allotted to a buried insulation layer 3.

In the present embodiment, the provision of SiC thin film layer 20 makes it possible to set electric field strength allowing avalanche in the portion having concentrated electrode field strength higher by one order of magnitude, so that higher breakdown voltage can be achieved as described in the first embodiment.

Eight Embodiment

Figure 18:
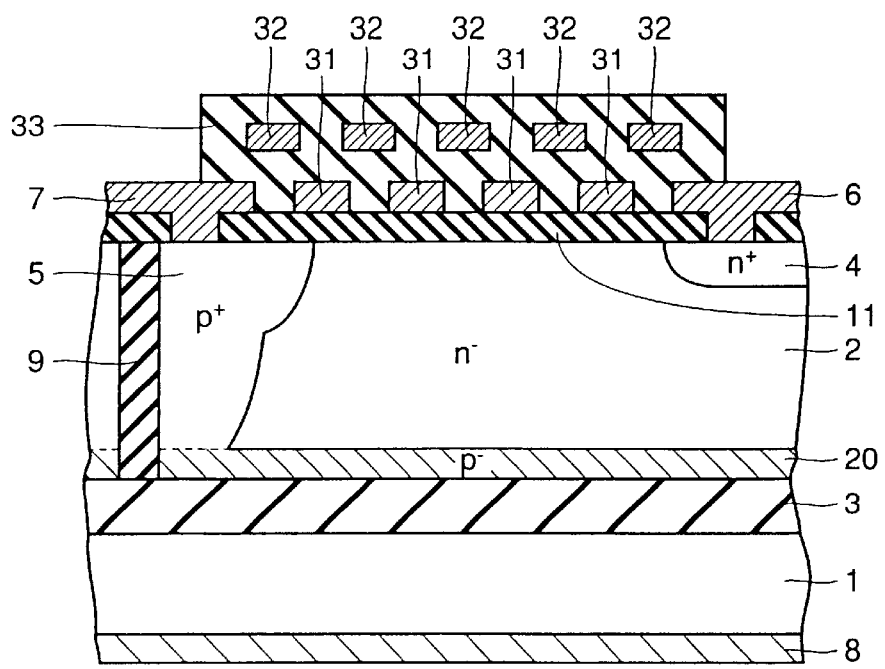

With reference to FIG. 18, in the present embodiment, an SiC thin film layer 20 has the opposite conductivity type (p type) of an n⁻ semiconductor layer 2 and is electrically directly short-circuited to a p⁺ semiconductor region 5. In addition, SiC thin film layer 20 has impurity concentration lower than that of p⁺ semiconductor region 5. It is noted that the other parts of the structure are almost same as those in the first embodiment shown in FIG. 1, and therefore the same component has the same reference numeral and the description thereof will not be repeated here.

The operation of the present embodiment is almost the same as that in the seventh embodiment shown in FIG. 17.

Further, in the present embodiment, the provision of SiC thin film layer 20 makes it possible to set electric field strength allowing avalanche in the portion having concentrated electric field strength higher by one order of magnitude, so that higher breakdown voltage can be achieved as described in the first embodiment.

Ninth Embodiment

Figure 19:
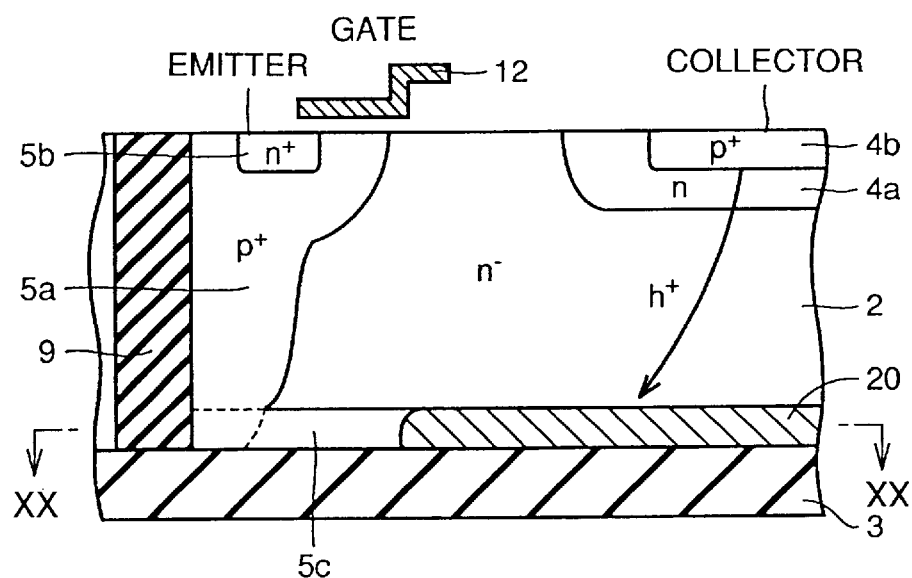
Figure 20:
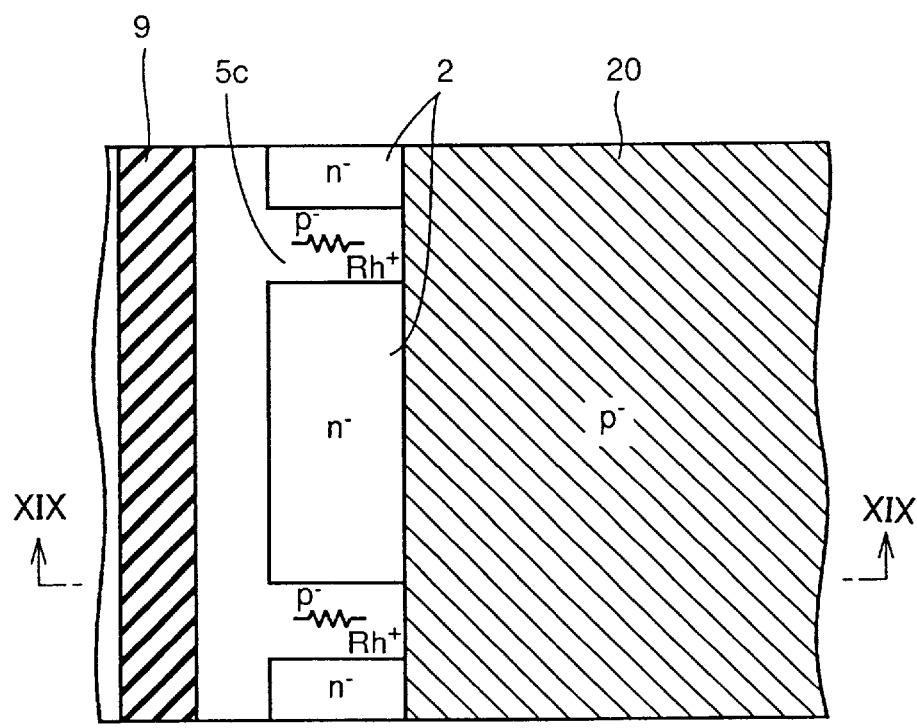
FIG. 20 is a schematic cross sectional view taken along the line XX—XX in FIG. 19.

FIG. 19 is a cross section taken along the line XIX—XIX in FIG. 20. A semiconductor substrate under a buried insulation layer 3 is conveniently omitted for description.

With reference to FIGS. 19 and 20, a lateral high breakdown voltage element in the present embodiment is an IGBT which includes a p⁺ semiconductor region 5a, an n⁺ emitter region 5b, an n type semiconductor region 4a, a p⁺ collector region 4b and a gate electrode layer 12.

The region of n⁻ semiconductor layer 2 is herein used as it is as an n⁻ drift region, forming a pn junction with p⁺ semiconductor region 5a. The n⁺ emitter region 5b is formed in the surface of p⁺ semiconductor region 5a. Further, n type semiconductor region 4a is formed in the surface of n⁻ drift region 2 and p⁺ collector region 4b is formed in the surface of n type semiconductor region 4a. A gate electrode layer 12 is formed to face the surface region of p⁺ semiconductor region 5a sandwiched between n⁺ emitter region 5b and n⁻ drift region 2 with a gate insulation layer (not shown) interposed.

Further, a p⁻ SiC thin film layer 20a is formed immediately below n type semiconductor region 4a in the bottom surface of a semiconductor layer 2. The n⁻ drift region 2 and p⁻ semiconductor region 5c are alternately formed along the bottom surface of semiconductor layer 2 between p⁻ SiC thin film layer 20 and p⁺ semiconductor region 5a. The p⁻ SiC thin film layer 20 is electrically short-circuited to p⁺ semiconductor region 5a with p⁻ semiconductor region 5c interposed.

In a plan view shown in FIG. 20, preferably, p⁻ semiconductor region 5c occupies at most twenty percent and n⁻ drift region 2 occupies at least eighty percent.

In the present embodiment, a depletion layer extends and high breakdown voltage can be achieved upon application of reverse bias basically in the same manner as in the above described seventh and eighth embodiments. Another advantage can additionally be obtained as an IGBT during on operation in the present embodiment. This is now described.

Hole current (h⁺) introduced from a p⁺ collector region 4b during on operation of the IGBT is likely to be re-introduced in p⁻ SiC thin film layer 20 located at a very short distance. In an IGBT, accumulation of sufficient current carriers in n⁻ drift region 2 in a turn on process allows low resistance condition referred to as conductivity modulation due to electron—hole pair, and the turn on process is completed. On the other hand, re-introduction of hole current (h⁺) into p⁻ SiC thin film layer 20 may disadvantageously decrease the number of holes to be accumulated within n⁻ drift region 2 and increase on voltage, as the ratio contributable to conductivity modulation decreases.

Accordingly, the present embodiment provides higher resistance Rh⁺ for p⁻ semiconductor region 5c by adopting a structure having alternately arranged p⁻ semiconductor region 5c and n⁻ drift region 2 as shown in FIG. 20. The high resistance Rh⁺ makes it difficult for hole current introduced into p⁻ SiC thin film layer 20 to flow into the p⁺ semiconductor region, thereby preventing introduction of hole current into p⁻ SiC thin film layer 20. As a result, the decrease in the number of holes to be accumulated within the n⁻ drift region can be prevented, thereby avoiding the increase in on voltage.

It is noted that a capacitive coupled multipled field plate can be provided also in the present embodiment.

Tenth Embodiment

Figure 21:
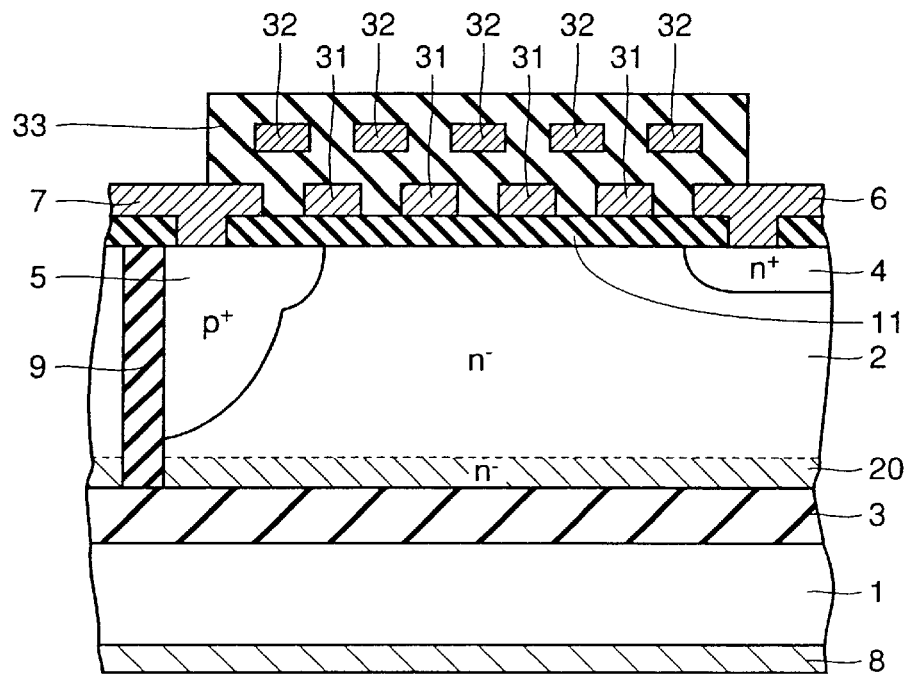
FIGS. 21 to 23 are cross sectional views schematically showing a structure of a semiconductor device having a lateral high breakdown voltage element according to tenth to twelfth embodiments of the present invention.

With reference to FIG. 21, in the present embodiment, a porous n⁻ SiC thin film layer 20 is formed over the entire bottom surface of a semiconductor layer 2 and adjacent to an n⁻ drift layer 2 and a buried insulation layer 3. It is noted that other parts of the structure are almost the same as those in the first embodiment shown in FIG. 1, and therefore the same component has the same reference numeral and the description thereof will not be repeated here.

Means for making a porous SiC thin film layer 20 is disclosed, for example, in Liang-Sheng Liao et al., "Intense blue emission from porous β-SiC formed on C⁺-implanted silicon", Appl. Phys. Lett. 66 (18), pp. 2382–2384, May 1, 1995. According to the disclosed method, a porous layer can be achieved through relatively simple electric field wet treatment, and the thickness of pore formation layer, pore diameter and pore density are sufficiently controllable.

Application of reverse bias to thus formed device allows rapid depletion of the entire region of semiconductor layer 2 while basically maintaining RESURF effect, so that the portion close to a cathode of porous n⁻ SiC thin film layer 20 has the highest electric field strength. Although avalanche current generates from SiC thin film layer 20 as the strength comes near to avalanche electric field strength, the diffusion and proliferation thereof can be prevented because of pores. As a result, still higher breakdown voltage can be achieved in addition to the above described effects in the seventh to ninth embodiments.

Eleventh Embodiment

Figure 22:
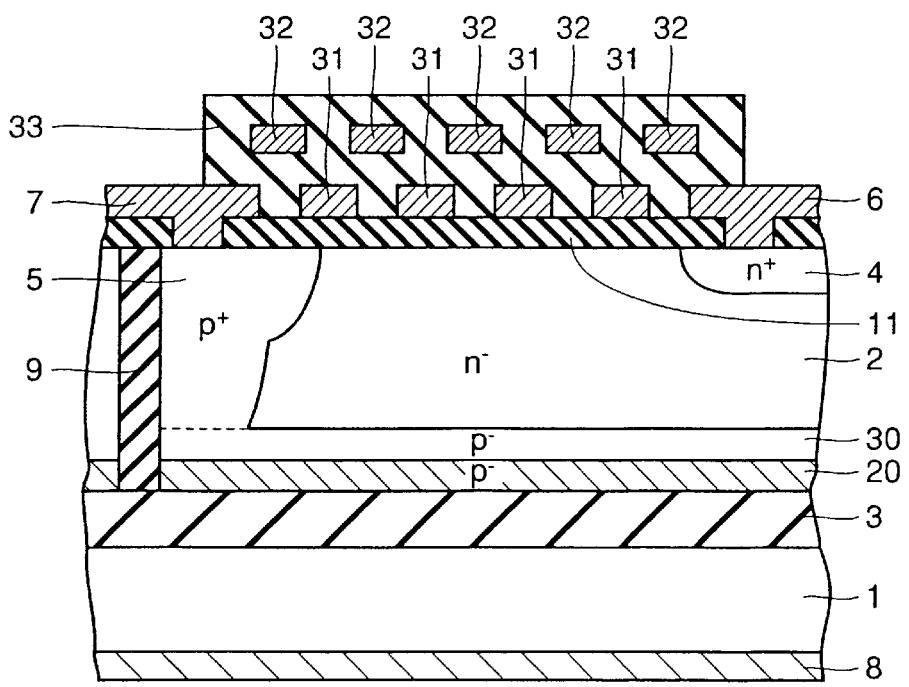

With reference to FIG. 22, in the present embodiment, a porous p⁻ SiC thin film layer 20 is formed on the bottom surface of a semiconductor layer 2 and a p⁻ semiconductor region 30 is formed over and adjacent to the p⁻ SiC thin film layer 20. The p⁻ SiC thin film layer 20 and a p⁻ semiconductor region 30 are electrically short-circuited to a p⁺ semiconductor region 5 and are made porous. It is noted that the other parts of the structure are almost the same as those in the first embodiment shown in FIG. 1, and therefore the same component has the same reference numeral and the description thereof will not be repeated.

Anodized current flows only within p⁻ SiC thin film layer 20 which is a p type semiconductor region and p⁻ semiconductor region 30, so that these layers 20 and 30 can controllably be made porous.

In the present embodiment, higher breakdown voltage can be achieved upon application of reverse bias for the same reason as in the tenth embodiment.

Twelfth Embodiment

Figure 23:
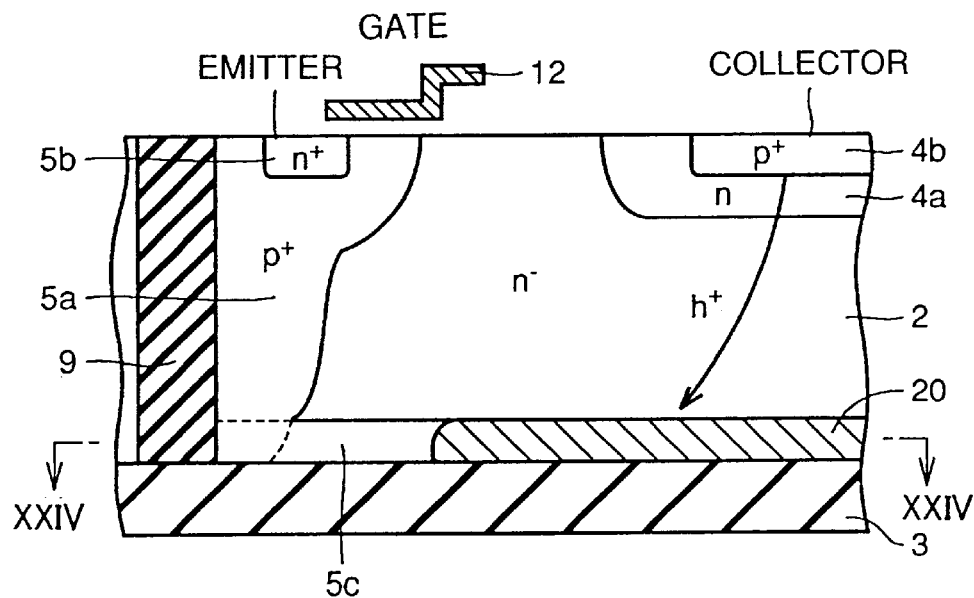
Figure 24:
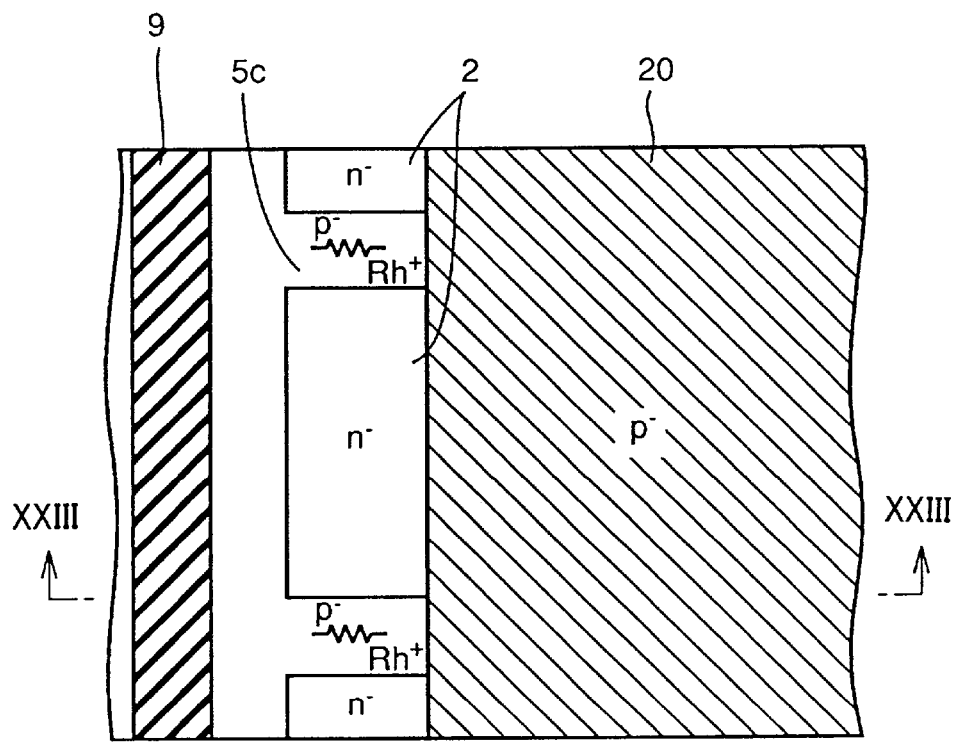
FIG. 24 is a schematic cross sectional view taken along the line XXIV—XXIV in FIG. 23.

FIG. 23 is a cross section taken along the line XXIII—XXIII in FIG. 24.

With reference to FIGS. 23 and 24, in the present embodiment, a p⁻ SiC thin film layer 20 in the bottom surface of a semiconductor layer 2 is made porous. A p⁻ semiconductor region 5c located between p⁻ SiC thin film layer 20 and a p⁺ semiconductor region 5a is also made porous.

It is noted that other parts of the structure are almost the same as those in the ninth embodiment shown in FIGS. 19 and 20, and therefore the same component has the same reference numeral and the description thereof will not be repeated here.

The advantage of higher breakdown voltage upon application of reverse bias and the effect of preventing the increase in on voltage during on operation in the present embodiment are the same as those mentioned in the ninth embodiment.

In addition, porous p⁻ SiC thin film layer 20 and p⁻ semiconductor region 5c can prevent the diffusion and proliferation of avalanche current as described in the tenth and eleventh embodiments, so that higher breakdown voltage can be achieved.

It is noted that a capacitive coupled multiple field plate can be provided in the present invention.

Thirteenth Embodiment

A method of manufacturing an SOI substrate of a semiconductor device according to the above mentioned first, third and fourth embodiments will now be described as a thirteenth embodiment.

Figure 25:
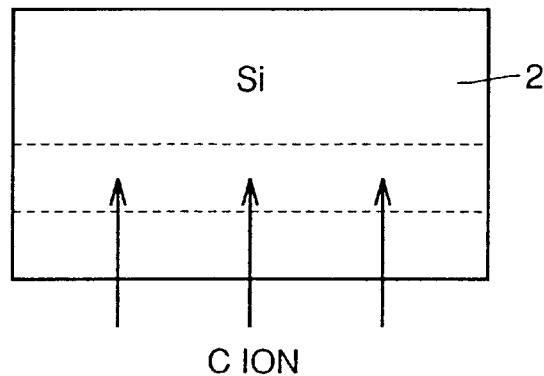
FIGS. 25 to 28 are schematic cross sectional views showing in order a method of manufacturing a semiconductor device having a lateral high breakdown voltage element according to a thirteenth embodiment of the present invention.

First, with reference to FIG. 25, C (carbon) ion is implanted in the surface on the side for application of a semiconductor layer 2 formed of silicon. The temperature should be maintained at 800° C. or higher during implantation and dosage is not less than $1 \times 10^{16}$ cm$^{-2}$.

Figure 26:
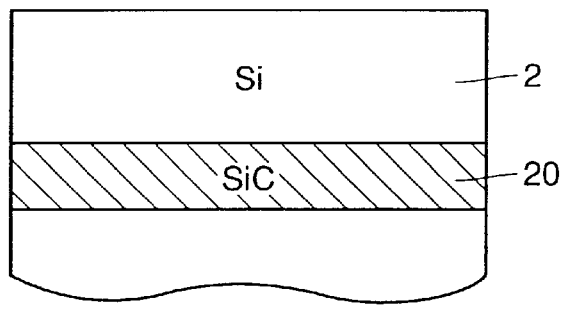

With reference to FIG. 26, SiC is crystallized by heat treatment at 1100° C. or higher for at least 3 hours after C ion implantation to form an SiC thin film layer 20 in semiconductor layer 2.

Figure 27:
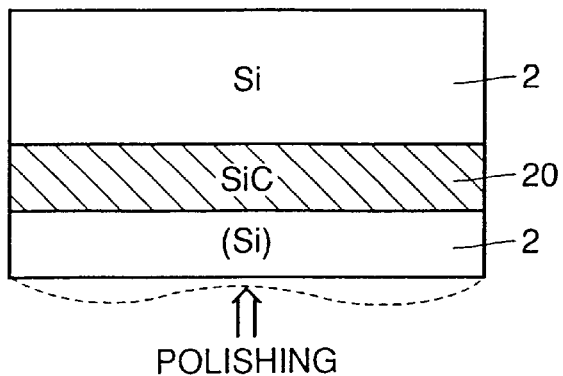

With reference to FIG. 27, the surface on the side for application of semiconductor layer 2 is precisely polished by means of CMP (Chemical Mechanical Polishing) or the like, and a part or entire portion of the thin film SiC layer 2 remaining on the side for application of SiC thin film layer 20 is removed. As a result, the surface on the side for application of semiconductor substrate 2 is planarized.

Figure 28:
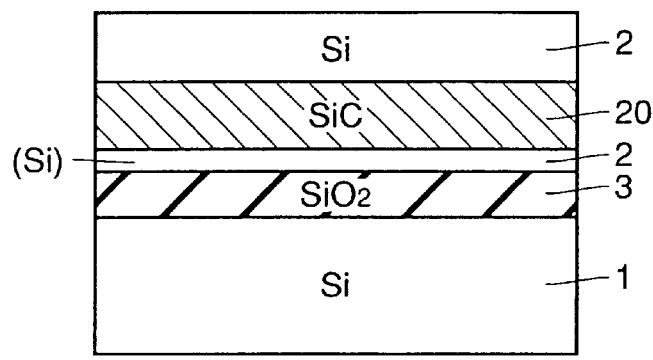

With reference to FIG. 28, a buried oxide film 3 and a silicon substrate 1 are applied over the surface on the side for application of semiconductor layer 2 and an SOI substrate is formed.

The application in accordance with the manufacturing method according to the present embodiment allows yield increase and manufacture of the SOI substrate having a stable applied interface characteristics.

Fourteenth Embodiment

Figure 29:
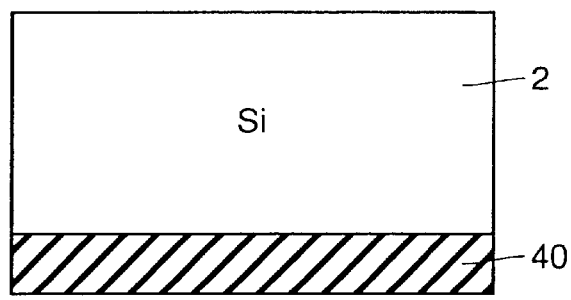
FIGS. 29 to 31 are schematic cross sectional views showing in order a method of manufacturing a semiconductor device having a lateral high breakdown voltage element according to a fourteenth embodiment of the present invention.

With reference to FIG. 29, an implantation thick film mask 40, formed of a silicon oxide film (SiO$_2$ film) or a silicon nitride film (Si$_3$N$_4$ film) having thickness of at least 2000 Å is formed over the surface on the side for application of a semiconductor layer 2 formed of silicon.

Figure 30:
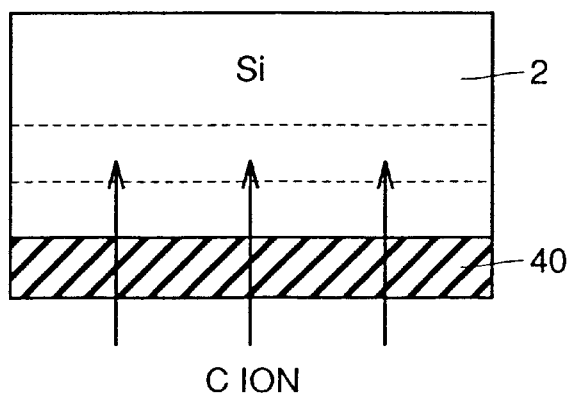

With reference to FIG. 30, C ion is implanted into semiconductor substrate 2 through implantation thick film mask 40. The temperature should be maintained at least at 800° C. during implantation and dosage is at least $1 \times 10^{16}$ cm$^{-2}$.

Figure 31:
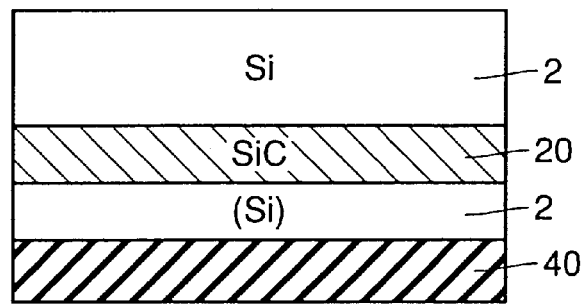

With reference to FIG. 31, SiC is crystallized by heat treatment at 1100° C. or higher for at least 3 hours after the C ion implantation to form an SiC thin film layer 20 in semiconductor layer 2. Meanwhile, SiC is crystallized while the surface on the side for application of semiconductor layer 2 is kept planar because of the presence of implantation thick film mask 40.

Subsequently, an SOI substrate is formed through similar steps in the thirteenth embodiment shown in FIGS. 27 and 28 after removal of implantation thick film mask 40.

The application in accordance with the manufacturing method of the present embodiment allows yield increase and the manufacture of an SOI substrate having a stable applied interface characteristics.

Implantation thick film mask 40 can also be formed by means of sputtering of SiC, plasma CVD or the like. This is especially effective when introduction of different impurity may have adverse affect device characteristics, such as a knock on phenomena, during C ion implantation.

Fifteenth Embodiment

Figure 32:
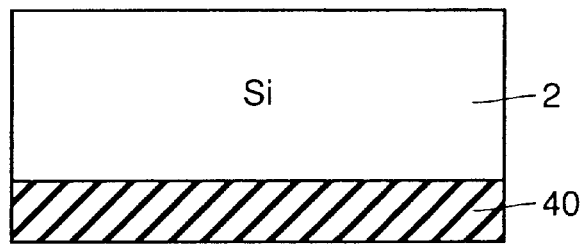
FIGS. 32 to 35 are schematic cross sectional views showing in order a method of manufacturing a semiconductor device having a lateral high breakdown voltage according to a fifteenth embodiment of the present invention.

With reference to FIG. 32, implantation thick film mask 40 is formed over the surface on the side for application of a silicon substrate 2.

Figure 33:
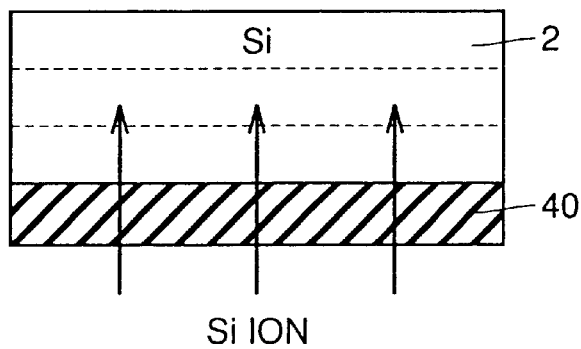

With reference to FIG. 33, Si ion is implanted into silicon layer 2 through implantation thick film mask 40. Thus, an amorphous silicon layer 2a is formed in a prescribed position in a semiconductor layer 2.

Figure 34:
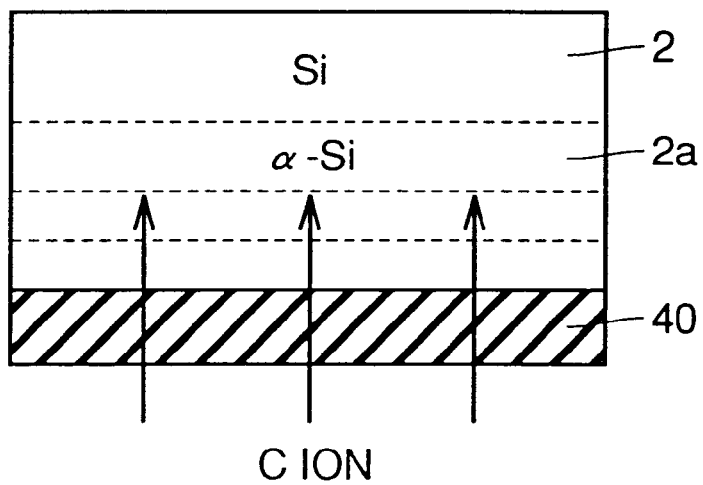

With reference to FIG. 34, C ion is implanted into silicon layer 2 through implantation thick film mask 40 with a shallower range than Si ion implantation (FIG. 33).

Figure 35:
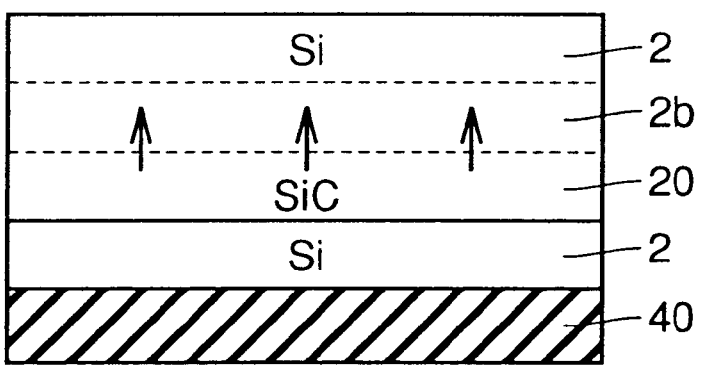
Figure 36:
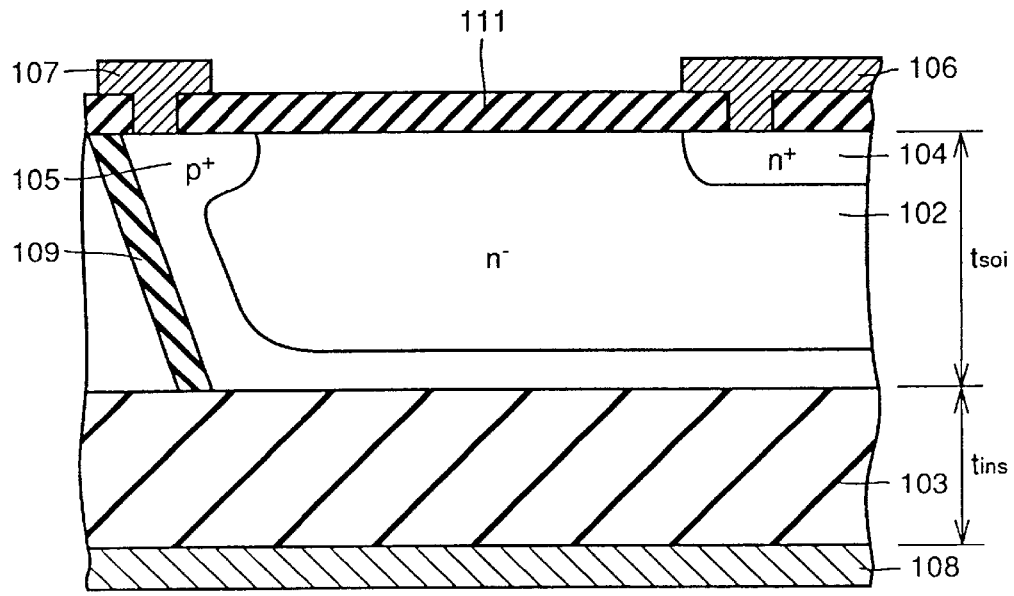
FIG. 36 is a schematic cross sectional view showing a first example of a semiconductor device having a conventional lateral high breakdown voltage element.
Figure 37:
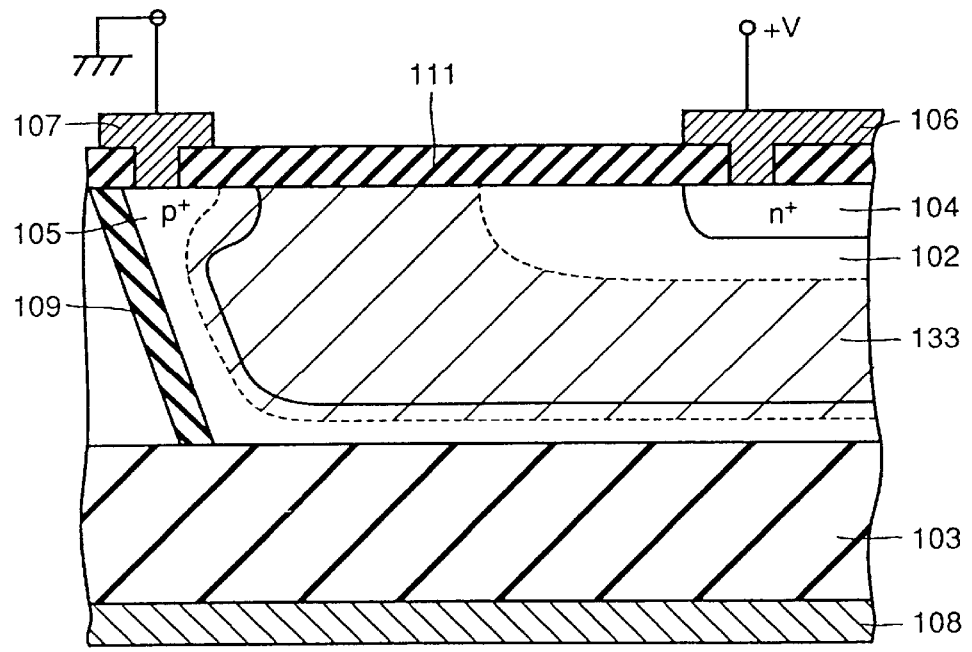
FIG. 37 is a view showing the operation of the high breakdown voltage element shown in FIG. 36.
Figure 38:
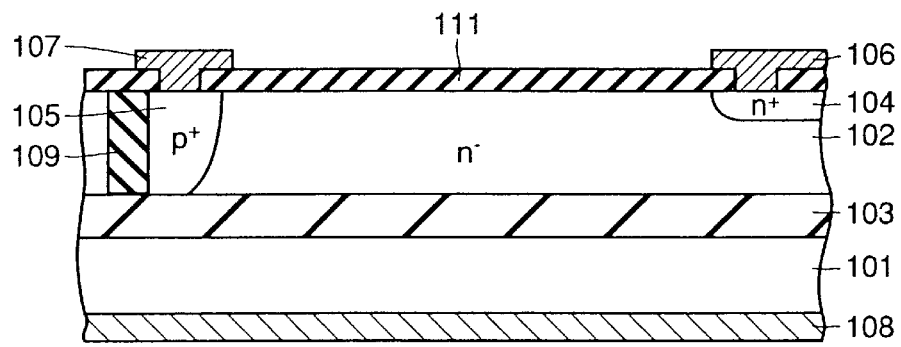
FIG. 38 is a schematic cross sectional view showing a second example of a semiconductor device having a conventional lateral breakdown voltage element.
Figure 39:
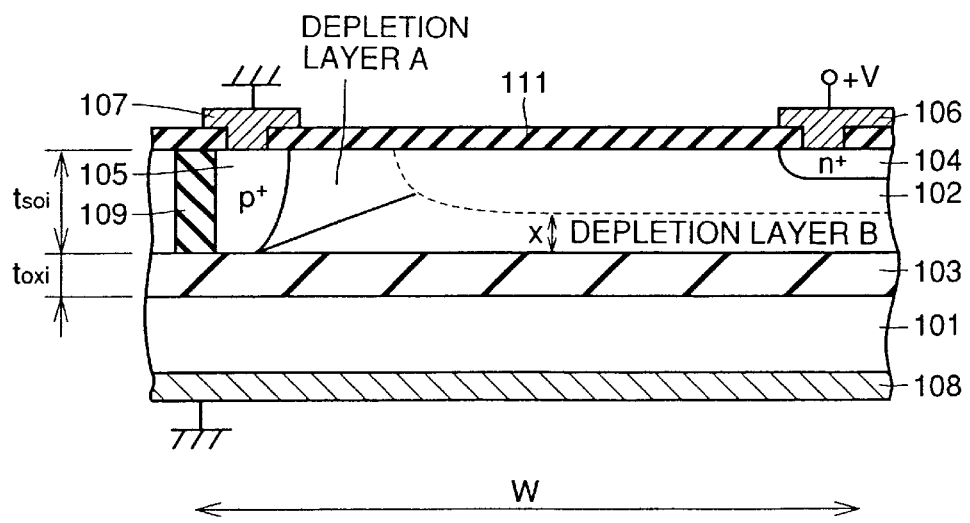
FIG. 39 is an illustration showing the operation of the lateral high breakdown voltage element shown in FIG. 38.
Figure 40:
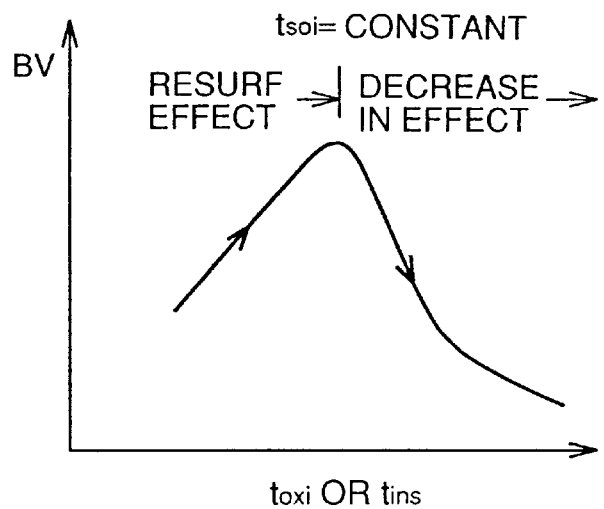
FIG. 40 is a graph showing the change in breakdown voltage with the thickness of a buried oxide film.
Figure 41:
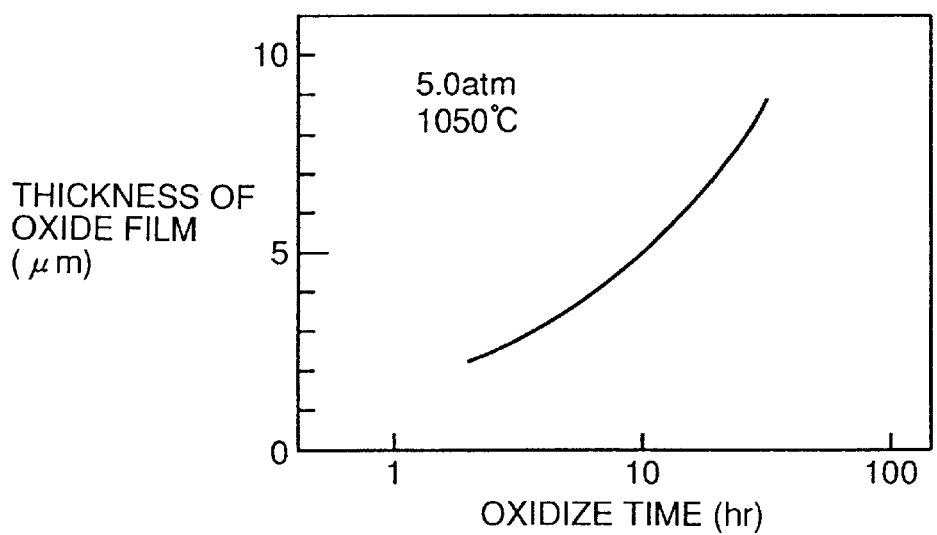
FIG. 41 is a graph showing a relation between oxidation time and the thickness of oxide film when a buried oxide film is formed by means of film formation method.

With reference to FIG. 35, SiC is crystallized by heat treatment at 1100° C. or higher for at least 3 hours after C ion implantation to form an SiC thin film layer 20 in semiconductor layer 2. Meanwhile, SiC crystallization proceeds in a direction toward the back side because of the presence of amorphous layer 2a, facilitating control of SiC crystal. In addition, SiC crystallization proceeds while the surface side is kept crystallized and planarized because of implantation thick film mask 40.

It is noted that though the above mentioned thirteenth to fifteenth embodiments are all based on C ion implantation, there are other applications based on a method of forming SiC by means of film formation such as CVD, disclosed, for example, in Japanese Patent Laying-Open No. 1-135070 or European Patent Application (EP-0317-445-B1) as an example which can result in a similar structure. The thirteenth to fifteenth embodiments of the present invention is effective in that planarization can be basically maintained during application and a combination for application can be selected from Si/SiO$_2$, SiC/SiO$_2$, SiC/Si, SiO$_2$/SiO$_2$ and the like, according to the purpose.

Further, while the SiC thin film layer is described as a wide band gap layer 20 in the first to fifteenth embodiments above, any material having a band gap wider than semiconductor layer 2 can be used. In addition, the material for wide band gap layer 20 is more preferably a material allowing fabrication of a device directly using a standard Si process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a semiconductor layer formed on a semiconductor substrate with a buried insulation layer interposed, with a high breakdown voltage element formed at said semiconductor layer, said high breakdown voltage element having first and second impurity regions of mutually opposite conductivity types formed on said semiconductor layer, said semiconductor device comprising:

a wide band gap layer positioned at least in a region which is to have highest electric field strength in said semiconductor layer when breakdown voltage is applied to said high breakdown voltage element, and formed of a material having a band gap wider than that of said semiconductor layer;

a conductive layer for a field plate formed in a floating state on the region of said semiconductor layer which is sandwiched between said first and second impurity regions with an insulation layer interposed, and capable of storing capacitance between itself and a first electrode electrically connected to said first impurity region as well as between itself and a second electrode electrically connected to said second impurity region; and a drift region positioned in said semiconductor layer between said first and second impurity regions and having same conductivity type as said first impurity region and a lower impurity concentration than that of said first impurity region;

wherein said wide band gap layer has impurity of same conductivity type as said drift region and impurity concentration at least twice and at most ten times that of said drift region.

2. The semiconductor device with a lateral high breakdown voltage according to claim 1, wherein said wide band gap layer includes a SiC layer.

3. The semiconductor device with a lateral high breakdown voltage element according to claim 1, wherein said wide band gap layer is located in a bottom surface of said semiconductor layer on the side of said buried insulation layer.

* * * * *